United States Patent
Andersson et al.

(10) Patent No.: US 9,809,445 B2
(45) Date of Patent: Nov. 7, 2017

(54) ELECTROMECHANICAL SYSTEM STRUCTURES WITH RIBS HAVING GAPS

(75) Inventors: Mark B. Andersson, Northborough, MA (US); Joyce H. Wu, Somerville, MA (US); Jasper Lodewyk Steyn, Winchester, MA (US)

(73) Assignee: QUALCOMM Incorporated, San Diego, CA (US)

( * ) Notice: Subject to any disclaimer, the term of this patent is extended or adjusted under 35 U.S.C. 154(b) by 1349 days.

(21) Appl. No.: 13/591,842

(22) Filed: Aug. 22, 2012

(65) Prior Publication Data
US 2013/0050290 A1 Feb. 28, 2013

Related U.S. Application Data

(60) Provisional application No. 61/527,843, filed on Aug. 26, 2011.

(51) Int. Cl.
*B81B 3/00* (2006.01)
*G02B 26/02* (2006.01)
*G09G 3/34* (2006.01)

(52) U.S. Cl.
CPC ............ *B81B 3/007* (2013.01); *G02B 26/023* (2013.01); *B81B 2201/047* (2013.01); *B81B 2203/0109* (2013.01); *B81B 2203/0163* (2013.01); *B81B 2203/0307* (2013.01); *B81B 2203/051* (2013.01); *G09G 3/346* (2013.01); *G09G 3/3473* (2013.01); *G09G 2300/08* (2013.01)

(58) Field of Classification Search
CPC . B81B 3/0072; B81B 3/0056; B81C 1/00047; B81C 1/00067
See application file for complete search history.

(56) References Cited

U.S. PATENT DOCUMENTS

| 3,985,579 A | 10/1976 | Rahilly |
| 4,420,650 A | 12/1983 | Wise et al. |
| 5,067,985 A | 11/1991 | Carver et al. |
| 6,535,663 B1 | 3/2003 | Chertkow |

(Continued)

FOREIGN PATENT DOCUMENTS

| WO | 2008085252 | 7/2008 |
| WO | 2008140926 A2 | 11/2008 |

(Continued)

OTHER PUBLICATIONS

Taiwan Search Report—TW101130707—TIPO—dated Feb. 19, 2015.
International Search Report and Written Opinion—PCT/US2012/052103—ISA/EPO—dated Nov. 26, 2012.

*Primary Examiner* — Grant Sitta
*Assistant Examiner* — Amen Bogale
(74) *Attorney, Agent, or Firm* — Foley & Lardner LLP

(57) ABSTRACT

This disclosure provides systems, methods and apparatus for an electromechanical systems (EMS) assembly. The EMS assembly includes a substrate, an anchor disposed on the substrate, and a suspended planar body supported over the substrate by the anchor. The suspended planar body includes at least one depression extending out of a plane of the suspended planar body and protruding towards the substrate. The suspended planar body also includes a substantially horizontal portion corresponding to a gap in the at least one depression. An extent of the gap is up to 20% of a length of the suspended planar body.

15 Claims, 28 Drawing Sheets

(56) References Cited

U.S. PATENT DOCUMENTS

| | | |
|---|---|---|
| 7,289,259 B2 | 10/2007 | Chui et al. |
| 7,706,042 B2 | 4/2010 | Chung et al. |
| 7,719,752 B2 | 5/2010 | Sampsell et al. |
| 8,004,064 B2 | 8/2011 | Shoji |
| 8,068,268 B2 * | 11/2011 | Heald .................. B81B 3/0072 359/290 |
| 2006/0076632 A1 | 4/2006 | Palmateer et al. |
| 2006/0171628 A1 * | 8/2006 | Naniwada ............ B81B 3/0072 385/18 |
| 2006/0250325 A1 | 11/2006 | Hagood et al. |
| 2007/0086078 A1 * | 4/2007 | Hagood ............... G09G 3/3433 359/298 |
| 2011/0255146 A1 * | 10/2011 | Brosnihan .............. G02B 26/02 359/298 |

FOREIGN PATENT DOCUMENTS

| | | | |
|---|---|---|---|
| WO | 2009006162 | 1/2009 | |
| WO | WO 2010062616 A2 * | 6/2010 | ............ G02B 26/02 |

* cited by examiner

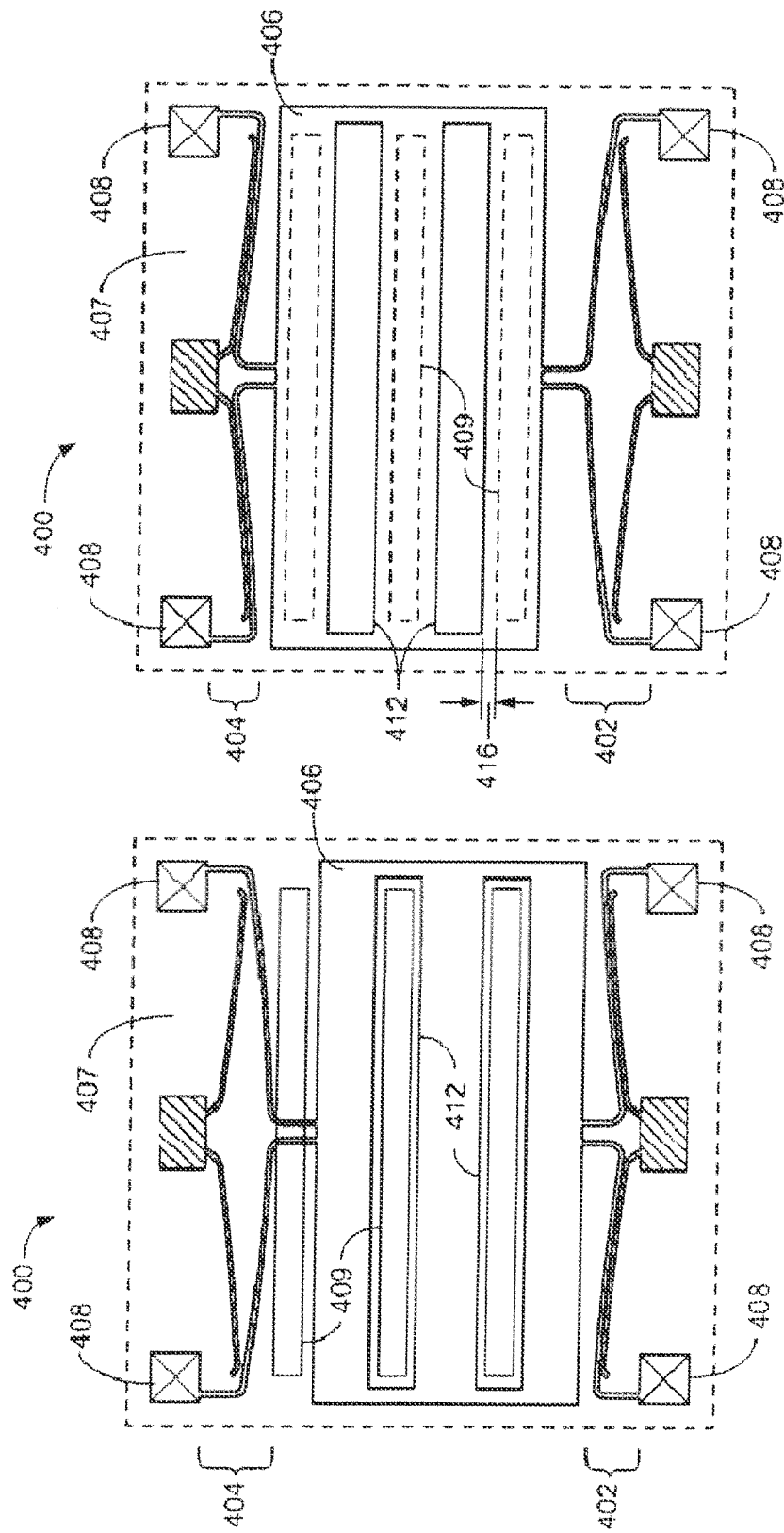

ELECTROMECHANICAL SYSTEM STRUCTURES WITH RIBS HAVING GAPS

CROSS-REFERENCE TO RELATED APPLICATION

This Patent Application claims the benefit of U.S. Provisional Patent Application No. 61/527,843, filed on Aug. 26, 2011, entitled "Micro-electromechanical Device and Method of Manufacturing." The disclosure of the prior Application is considered part of and is incorporated by reference in its entirety in this Patent Application.

TECHNICAL FIELD

This disclosure relates to electromechanical systems (EMS). In particular, this disclosure relates to EMS structures with ribs having gaps to provide stress relief and localized deformation.

DESCRIPTION OF THE RELATED TECHNOLOGY

Certain displays are designed to generate images by modulating light using shutters. These shutters are supported and actuated by shutter assemblies that, in addition to a shutter, include actuators for actuating the shutter, and anchors for supporting the shutter over a substrate. Such shutters have a tendency to deform out of their desired configuration. This tendency can be combated by including a rib that extends across a shutter. Although the inclusion of a rib provides a stiffer shutter, stresses imposed on the stiffer shutter can cause out-of-plane deformation of the entire shutter. Such global deformations adversely impact manufacturability of shutter assemblies, as well as adversely impact proper functioning of the shutter assemblies.

SUMMARY

The systems, methods and devices of the disclosure each have several innovative aspects, no single one of which is solely responsible for the desirable attributes disclosed herein.

One innovative aspect of the subject matter described in this disclosure can be implemented in an EMS assembly including a substrate, an anchor disposed on the substrate, and a suspended planar body supported over the substrate by the anchor. The suspended planar body includes at least one depression extending out of a plane of the suspended planar body and protruding towards the substrate. The suspended planar body also includes a substantially horizontal portion corresponding to a gap in the at least one depression. The substantially horizontal portion extends along the plane of the suspended planar body from a first edge of the suspended planar body to an opposing second edge of the suspended planar body, and an extent of the gap is up to 20% of a length of the suspended planar body.

In some implementations, the first edge and the second edge are substantially perpendicular to a direction of motion of the suspended planar body. In some implementations, a thickness of the suspended planar body at the first edge is substantially the same as a thickness of the suspended planar body at the second edge. In some implementations, the suspended planar body is formed with an aperture, the first edge forms at least a portion of an outer periphery of the suspended planar body, and the second edge forms at least a portion of a perimeter of the aperture.

In some implementations, the substantially horizontal portion faces away from the substrate. In some implementations, the substantially horizontal portion is disposed between portions of a single continuous depression. In other implementations, the substantially horizontal portion is disposed between multiple, distinct depressions. In some implementations, the suspended planar body is a shutter of a shutter-based light modulator.

Another innovative aspect of the subject matter described in this disclosure can be implemented in an EMS assembly including a substrate, an anchor disposed on the substrate, and a suspended planar body supported over the substrate by the anchor. The suspended planar body defines a first aperture and a second aperture and includes at least one depression extending out of a plane of the suspended planar body. The suspended planar body also includes a substantially horizontal portion corresponding to a gap in the at least one depression. The substantially horizontal portion extends along the plane of the suspended planar body from a first edge of the suspended planar body to an opposing second edge of the suspended planar body, the first edge forms at least a portion of a perimeter of the first aperture, and the second edge forms at least a portion of a perimeter of the second aperture.

In some implementations, an extent of the gap is smaller than a width of the at least one depression. In some implementations, the substantially horizontal portion overlaps a geometric center of the suspended planar body. In some implementations, the first edge and the second edge are substantially perpendicular to a direction of motion of the suspended planar body.

Another innovative aspect of the subject matter described in this disclosure can be implemented in an EMS assembly including a substrate, an anchor disposed on the substrate, and a suspended planar body supported over the substrate by the anchor. The suspended planar body includes at least one depression extending out of a plane of the suspended planar body. The suspended planar body also includes a substantially horizontal portion corresponding to a gap in the at least one depression. The substantially horizontal portion extends along the plane of the suspended planar body from a first edge of the suspended planar body to an opposing second edge of the suspended planar body. At least one of the first edge and the second edge is substantially perpendicular to a length of the suspended planar body, and an extent of the gap is up to 20% of the length of the suspended planar body.

In some implementations, at least one of the first edge and the second edge is substantially parallel to a direction of motion of the suspended planar body. In some implementations, the extent of the gap is up to 10% of the length of the suspended planar body. In some implementations, the suspended planar body is formed with an aperture, the first edge forms at least a portion of a side edge of the suspended planar body, and the second edge forms at least a portion of a side edge of the aperture.

Another innovative aspect of the subject matter described in this disclosure can be implemented in a display apparatus including a backlight and an aperture layer positioned in front of the backlight and defining a plurality of apertures. The display apparatus also includes an EMS light modulator configured to modulate light emitted by the backlight passing through the apertures to form an image on the display apparatus. The EMS light modulator includes a shutter. The shutter includes a first surface facing towards the aperture layer and a second surface facing away from the aperture layer. The shutter also includes at least one depression formed in the shutter, and a gap in the at least one depression. The gap is defined by a first substantially horizontal portion of the first surface and a second substantially horizontal portion of the second surface. Each of the first substantially horizontal portion and the second substantially horizontal portion extends from a first edge of the shutter to an opposing second edge of the shutter, and an extent of the gap is up to 20% of a length of the shutter.

In some implementations, each of the first edge and the second edge is substantially perpendicular to a direction of shutter motion. In some implementations, the at least one depression protrudes away from the aperture layer. In some implementations, a thickness of the shutter at the first edge is substantially the same as a thickness of the shutter at the second edge.

Details of one or more implementations of the subject matter described in this specification are set forth in the accompanying drawings and the description below. Although the examples provided in this summary are primarily described in terms of microelectromechanical systems (MEMS)-based displays, the concepts provided herein may apply to other types of displays, such as liquid crystal displays (LCD), organic light emitting diode (OLED) displays, electrophoretic displays, and field emission displays, as well as to other non-display MEMS devices, such as MEMS microphones, sensors, and optical switches. Other features, aspects, and advantages will become apparent from the description, the drawings, and the claims. Note that the relative dimensions of the following figures may not be drawn to scale.

BRIEF DESCRIPTION OF THE DRAWINGS

FIG. 4A and FIG. 4B show examples views of a dual actuator shutter assembly.

Like reference numbers and designations in the various drawings indicate like elements.

DETAILED DESCRIPTION

To mitigate against global deformations of EMS structures, stress relief features are provided in one or more portions of a single continuous rib or depression or in multiple ribs or depressions. The structures can be nanoelectromechancial systems (NEMS), microelectromechanical systems (MEMS), or larger scale structures. In some implementations, an EMS assembly includes a substrate, an anchor disposed on the substrate, and a suspended planar body supported over the substrate by the anchor. The suspended planar body can be, for example, a shutter of an EMS light modulator. The suspended planar body includes at least one depression extending out of a plane of the suspended planar body, and a substantially horizontal portion corresponding to a gap in the at least one depression. The substantially horizontal portion provides a bending region that facilitates localized deformation and the relief of stresses on the suspended planar body. In some implementations, an extent of the gap is up to 20% of a length of the suspended planar body, such as up to 10%. In some implementations, the substantially horizontal portion is adjacent to a beam attachment location of the suspended planar body. In other implementations, the substantially horizontal portion extends between apertures formed in the suspended planar body. In other implementations, the substantially horizontal portion is adjacent to a side edge of the suspended planar body.

Particular implementations of the subject matter described in this disclosure can be implemented to realize one or more of the following potential advantages. The inclusion of a gap between or along one or more ribs or depressions provides for the relief of stresses, such as stresses imposed on an EMS structure during manufacturing or actuation as well as stresses imposed on the EMS structure by temperature fluctuations or other external conditions. Doing so confines the impact of those stresses to localized deformations of the EMS structure, instead of global deformations that can adversely impact manufacturability as well as proper functioning of an EMS assembly. In such fashion, an EMS structure can be stiffened by one or more ribs, while stress relief can be provided by one or more gaps between or along the ribs.

Figure 1A:
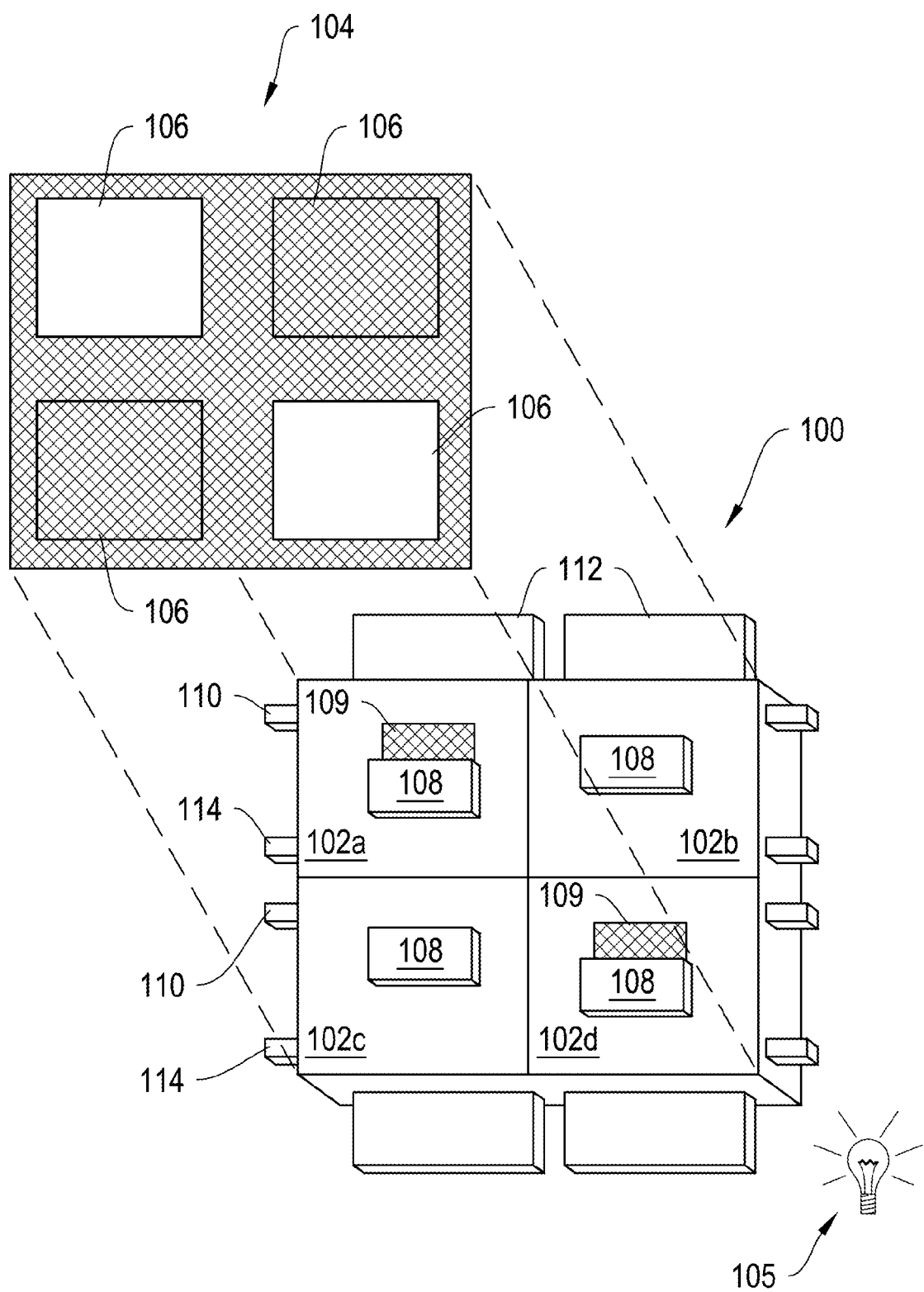
FIG. 1A shows an example schematic diagram of a direct-view MEMS-based display apparatus.

FIG. 1A shows a schematic diagram of a direct-view microelectromechanical system (MEMS)-based display apparatus 100. The display apparatus 100 includes a plurality of light modulators 102a-102d (generally "light modulators 102") arranged in rows and columns. In the display apparatus 100, the light modulators 102a and 102d are in the open state, allowing light to pass. The light modulators 102b and 102c are in the closed state, obstructing the passage of light. By selectively setting the states of the light modulators 102a-102d, the display apparatus 100 can be utilized to form an image 104 for a backlit display, if illuminated by a lamp or lamps 105. In another implementation, the apparatus 100 may form an image by reflection of ambient light originating from the front of the apparatus. In another implementation, the apparatus 100 may form an image by reflection of light from a lamp or lamps positioned in the front of the display, i.e., by use of a front light.

In some implementations, each light modulator 102 corresponds to a pixel 106 in the image 104. In some other implementations, the display apparatus 100 may utilize a plurality of light modulators to form a pixel 106 in the image 104. For example, the display apparatus 100 may include three color-specific light modulators 102. By selectively opening one or more of the color-specific light modulators 102 corresponding to a particular pixel 106, the display apparatus 100 can generate a color pixel 106 in the image 104. In another example, the display apparatus 100 includes two or more light modulators 102 per pixel 106 to provide luminance level in an image 104. With respect to an image, a "pixel" corresponds to the smallest picture element defined by the resolution of image. With respect to structural components of the display apparatus 100, the term "pixel" refers to the combined mechanical and electrical components utilized to modulate the light that forms a single pixel of the image.

The display apparatus 100 is a direct-view display in that it may not include imaging optics typically found in projection applications. In a projection display, the image formed on the surface of the display apparatus is projected onto a screen or onto a wall. The display apparatus is substantially smaller than the projected image. In a direct view display, the user sees the image by looking directly at the display apparatus, which contains the light modulators and optionally a backlight or front light for enhancing brightness and/or contrast seen on the display.

Direct-view displays may operate in either a transmissive or reflective mode. In a transmissive display, the light modulators filter or selectively block light which originates from a lamp or lamps positioned behind the display. The light from the lamps is optionally injected into a lightguide or "backlight" so that each pixel can be uniformly illuminated. Transmissive direct-view displays are often built onto transparent or glass substrates to facilitate a sandwich assembly arrangement where one substrate, containing the light modulators, is positioned directly on top of the backlight.

Each light modulator 102 can include a shutter 108 and an aperture 109. To illuminate a pixel 106 in the image 104, the shutter 108 is positioned such that it allows light to pass through the aperture 109 towards a viewer. To keep a pixel 106 unlit, the shutter 108 is positioned such that it obstructs the passage of light through the aperture 109. The aperture 109 is defined by an opening patterned through a reflective or light-absorbing material in each light modulator 102.

The display apparatus also includes a control matrix connected to the substrate and to the light modulators for controlling the movement of the shutters. The control matrix includes a series of electrical interconnects (e.g., interconnects 110, 112 and 114), including at least one write-enable interconnect 110 (also referred to as a "scan-line interconnect") per row of pixels, one data interconnect 112 for each column of pixels, and one common interconnect 114 providing a common voltage to all pixels, or at least to pixels from both multiple columns and multiples rows in the display apparatus 100. In response to the application of an appropriate voltage (the "write-enabling voltage, $V_{WE}$"), the write-enable interconnect 110 for a given row of pixels prepares the pixels in the row to accept new shutter movement instructions. The data interconnects 112 communicate the new movement instructions in the form of data voltage pulses. The data voltage pulses applied to the data interconnects 112, in some implementations, directly contribute to an electrostatic movement of the shutters. In some other implementations, the data voltage pulses control switches, e.g., transistors or other non-linear circuit elements that control the application of separate actuation voltages, which are typically higher in magnitude than the data voltages, to the light modulators 102. The application of these actuation voltages then results in the electrostatic driven movement of the shutters 108.

Figure 1B:
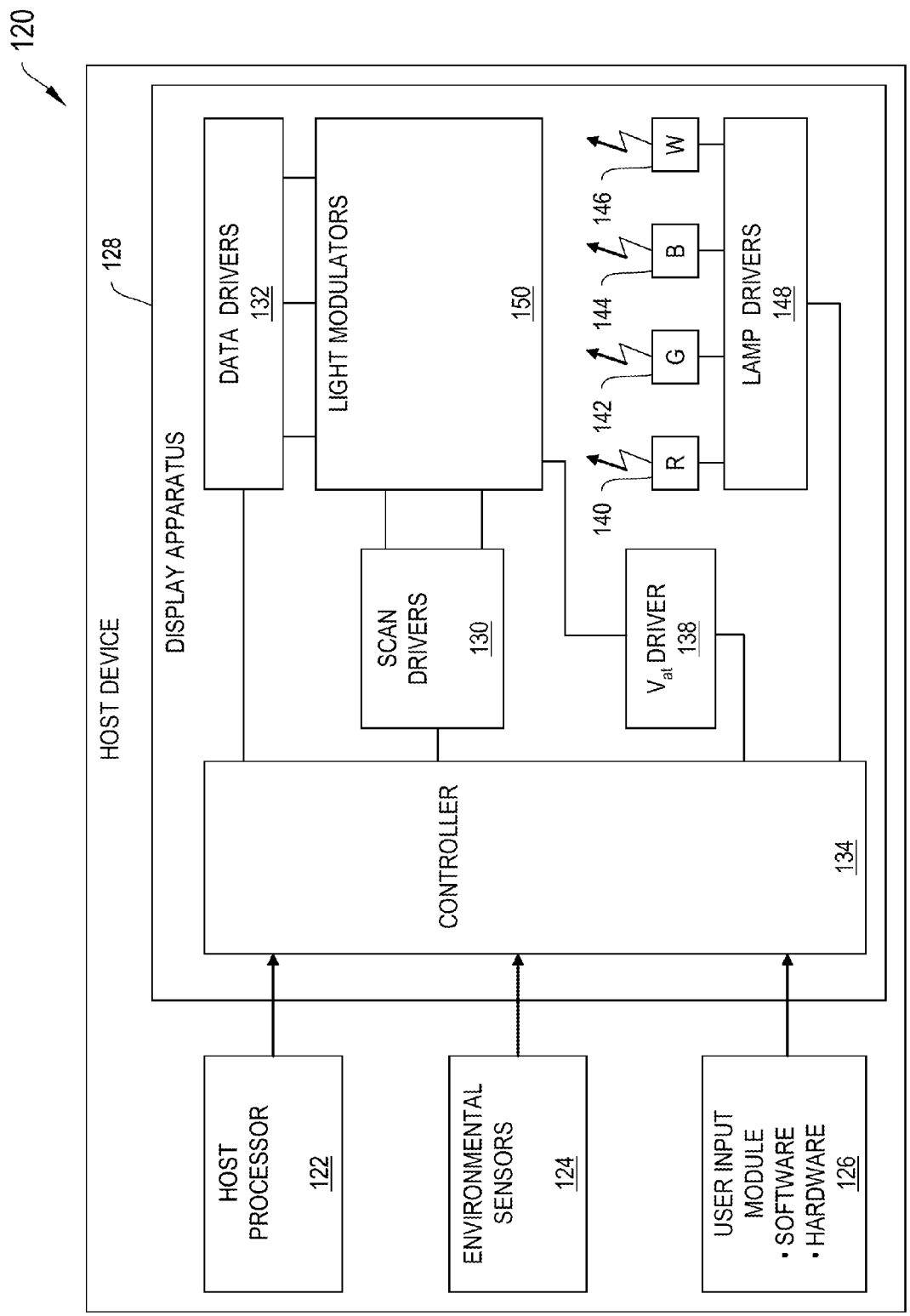
FIG. 1B shows an example block diagram of a host device.

FIG. 1B shows an example of a block diagram 120 of a host device (i.e., cell phone, smart phone, PDA, MP3 player, tablet, e-reader, etc.). The host device 120 includes a display apparatus 128, a host processor 122, environmental sensors 124, a user input module 126, and a power source.

The display apparatus 128 includes a plurality of scan drivers 130 (also referred to as "write enabling voltage sources"), a plurality of data drivers 132 (also referred to as "data voltage sources"), a controller 134, common drivers 138, lamps 140-146, and lamp drivers 148. The scan drivers 130 apply write enabling voltages to scan-line interconnects 110. The data drivers 132 apply data voltages to the data interconnects 112.

In some implementations of the display apparatus, the data drivers 132 are configured to provide analog data voltages to the light modulators, especially where the luminance level of the image 104 is to be derived in analog fashion. In analog operation, the light modulators 102 are designed such that when a range of intermediate voltages is applied through the data interconnects 112, there results a range of intermediate open states in the shutters 108 and therefore a range of intermediate illumination states or luminance levels in the image 104. In other cases, the data drivers 132 are configured to apply only a reduced set of 2, 3 or 4 digital voltage levels to the data interconnects 112. These voltage levels are designed to set, in digital fashion, an open state, a closed state, or other discrete state to each of the shutters 108.

The scan drivers 130 and the data drivers 132 are connected to a digital controller circuit 134 (also referred to as the "controller 134"). The controller sends data to the data drivers 132 in a mostly serial fashion, organized in predetermined sequences grouped by rows and by image frames. The data drivers 132 can include series to parallel data converters, level shifting, and for some applications digital to analog voltage converters.

The display apparatus optionally includes a set of common drivers 138, also referred to as common voltage sources. In some implementations, the common drivers 138 provide a DC common potential to all light modulators within the array of light modulators, for instance by supplying voltage to a series of common interconnects 114. In some other implementations, the common drivers 138, following commands from the controller 134, issue voltage pulses or signals to the array of light modulators, for instance global actuation pulses which are capable of driving and/or initiating simultaneous actuation of all light modulators in multiple rows and columns of the array.

All of the drivers (e.g., scan drivers 130, data drivers 132 and common drivers 138) for different display functions are time-synchronized by the controller 134. Timing commands from the controller coordinate the illumination of red, green and blue and white lamps (140, 142, 144 and 146 respectively) via lamp drivers 148, the write-enabling and sequencing of specific rows within the array of pixels, the output of voltages from the data drivers 132, and the output of voltages that provide for light modulator actuation.

The controller 134 determines the sequencing or addressing scheme by which each of the shutters 108 can be re-set to the illumination levels appropriate to a new image 104. New images 104 can be set at periodic intervals. For instance, for video displays, the color images 104 or frames of video are refreshed at frequencies ranging from 10 to 300 Hertz (Hz). In some implementations the setting of an image frame to the array is synchronized with the illumination of the lamps 140, 142, 144 and 146 such that alternate image frames are illuminated with an alternating series of colors, such as red, green and blue. The image frames for each respective color is referred to as a color subframe. In this method, referred to as the field sequential color method, if the color subframes are alternated at frequencies in excess of 20 Hz, the human brain will average the alternating frame images into the perception of an image having a broad and continuous range of colors. In alternate implementations, four or more lamps with primary colors can be employed in display apparatus 100, employing primaries other than red, green and blue.

In some implementations, where the display apparatus 100 is designed for the digital switching of shutters 108 between open and closed states, the controller 134 forms an image by the method of time division gray scale, as previously described. In some other implementations, the display apparatus 100 can provide gray scale through the use of multiple shutters 108 per pixel.

In some implementations, the data for an image state 104 is loaded by the controller 134 to the modulator array by a sequential addressing of individual rows, also referred to as scan lines. For each row or scan line in the sequence, the scan driver 130 applies a write-enable voltage to the write enable interconnect 110 for that row of the array, and subsequently the data driver 132 supplies data voltages, corresponding to desired shutter states, for each column in the selected row. This process repeats until data has been loaded for all rows in the array. In some implementations, the sequence of selected rows for data loading is linear, proceeding from top to bottom in the array. In some other implementations, the sequence of selected rows is pseudo-randomized, in order to minimize visual artifacts. And in some other implementations the sequencing is organized by blocks, where, for a block, the data for only a certain fraction of the image state 104 is loaded to the array, for instance by addressing only every $5^{th}$ row of the array in sequence.

In some implementations, the process for loading image data to the array is separated in time from the process of actuating the shutters 108. In these implementations, the modulator array may include data memory elements for each pixel in the array, and the control matrix may include a global actuation interconnect for carrying trigger signals, from common driver 138, to initiate simultaneous actuation of shutters 108 according to data stored in the memory elements.

In alternative implementations, the array of pixels and the control matrix that controls the pixels may be arranged in configurations other than rectangular rows and columns. For example, the pixels can be arranged in hexagonal arrays or curvilinear rows and columns. In general, as used herein, the term scan-line shall refer to any plurality of pixels that share a write-enabling interconnect.

The host processor 122 generally controls the operations of the host. For example, the host processor 122 may be a general or special purpose processor for controlling a portable electronic device. With respect to the display apparatus 128, included within the host device 120, the host processor 122 outputs image data as well as additional data about the host. Such information may include data from environmental sensors, such as ambient light or temperature; information about the host, including, for example, an operating mode of the host or the amount of power remaining in the host's power source; information about the content of the image data; information about the type of image data; and/or instructions for display apparatus for use in selecting an imaging mode.

The user input module 126 conveys the personal preferences of the user to the controller 134, either directly, or via the host processor 122. In some implementations, the user input module 126 is controlled by software in which the user programs personal preferences such as "deeper color," "better contrast," "lower power," "increased brightness," "sports," "live action," or "animation." In some other implementations, these preferences are input to the host using hardware, such as a switch or dial. The plurality of data inputs to the controller 134 direct the controller 134 to provide data to the various drivers 130, 132, 138 and 148 which correspond to optimal imaging characteristics.

An environmental sensor module 124 also can be included as part of the host device. The environmental sensor module 124 receives data about the ambient environment, such as temperature and/or ambient lighting conditions. The sensor module 124 can be programmed to distinguish whether the device is operating in an indoor or office environment versus an outdoor environment in bright daylight versus an outdoor environment at nighttime. The sensor module 124 communicates this information to the display controller 134, so that the controller 134 can optimize the viewing conditions in response to the ambient environment.

Figure 2:
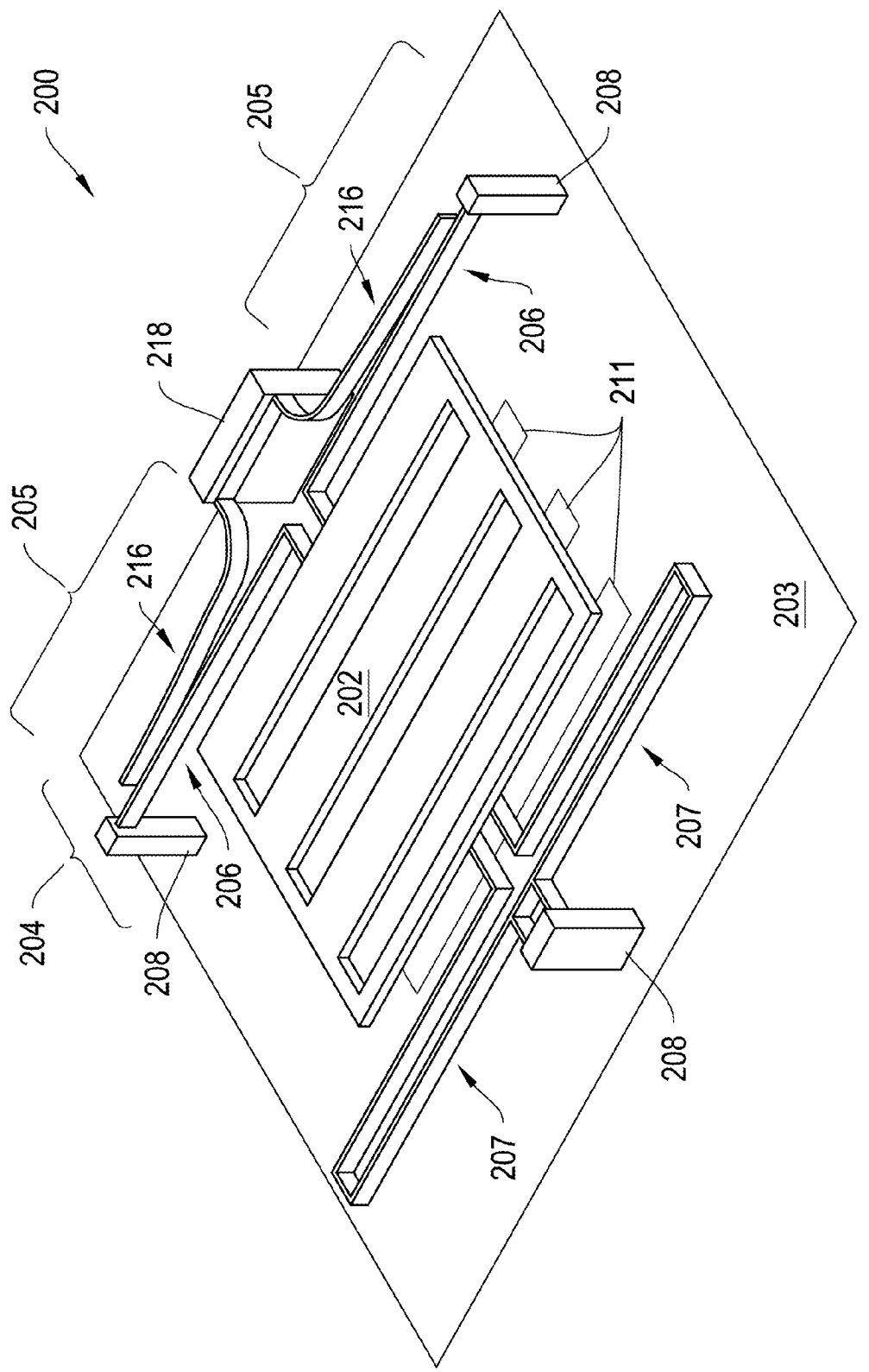
FIG. 2 shows an example perspective view of an illustrative shutter-based light modulator.

FIG. 2 shows a perspective view of an illustrative shutter-based light modulator 200. The shutter-based light modulator 200 is suitable for incorporation into the direct-view MEMS-based display apparatus 100 of FIG. 1A. The light modulator 200 includes a shutter 202 coupled to an actuator 204. The actuator 204 can be formed from two separate compliant electrode beam actuators 205 (the "actuators 205"). The shutter 202 couples on one side to the actuators 205. The actuators 205 move the shutter 202 transversely over a surface 203 in a plane of motion which is substantially parallel to the surface 203. The opposite side of the shutter 202 couples to a spring 207 which provides a restoring force opposing the forces exerted by the actuator 204.

Each actuator 205 includes a compliant load beam 206 connecting the shutter 202 to a load anchor 208. The load anchors 208 along with the compliant load beams 206 serve as mechanical supports, keeping the shutter 202 suspended proximate to the surface 203. The surface 203 includes one or more aperture holes 211 for admitting the passage of light. The load anchors 208 physically connect the compliant load beams 206 and the shutter 202 to the surface 203 and electrically connect the load beams 206 to a bias voltage, in some instances, ground.

If the substrate is opaque, such as silicon, then aperture holes 211 are formed in the substrate by etching an array of holes through the substrate. If the substrate is transparent, such as glass or plastic, then the aperture holes 211 are formed in a layer of light-blocking material deposited on the substrate. The aperture holes 211 can be generally circular, elliptical, polygonal, serpentine, or irregular in shape.

Each actuator 205 also includes a compliant drive beam 216 positioned adjacent to each load beam 206. The drive beams 216 couple at one end to a drive beam anchor 218 shared between the drive beams 216. The other end of each drive beam 216 is free to move. Each drive beam 216 is curved such that it is closest to the load beam 206 near the free end of the drive beam 216 and the anchored end of the load beam 206.

In operation, a display apparatus incorporating the light modulator 200 applies an electric potential to the drive beams 216 via the drive beam anchor 218. A second electric potential may be applied to the load beams 206. The resulting potential difference between the drive beams 216 and the load beams 206 pulls the free ends of the drive beams 216 towards the anchored ends of the load beams 206, and pulls the shutter ends of the load beams 206 toward the anchored ends of the drive beams 216, thereby driving the shutter 202 transversely toward the drive anchor 218. The compliant members 206 act as springs, such that when the voltage across the beams 206 and 216 potential is removed, the load beams 206 push the shutter 202 back into its initial position, releasing the stress stored in the load beams 206.

A light modulator, such as the light modulator 200, incorporates a passive restoring force, such as a spring, for returning a shutter to its rest position after voltages have been removed. Other shutter assemblies can incorporate a dual set of "open" and "closed" actuators and separate sets of "open" and "closed" electrodes for moving the shutter into either an open or a closed state.

There are a variety of methods by which an array of shutters and apertures can be controlled via a control matrix to produce images, in many cases moving images, with appropriate luminance levels. In some cases, control is accomplished by means of a passive matrix array of row and column interconnects connected to driver circuits on the periphery of the display. In other cases, it is appropriate to include switching and/or data storage elements within each pixel of the array (the so-called active matrix) to improve the speed, the luminance level and/or the power dissipation performance of the display.

Figure 3A:
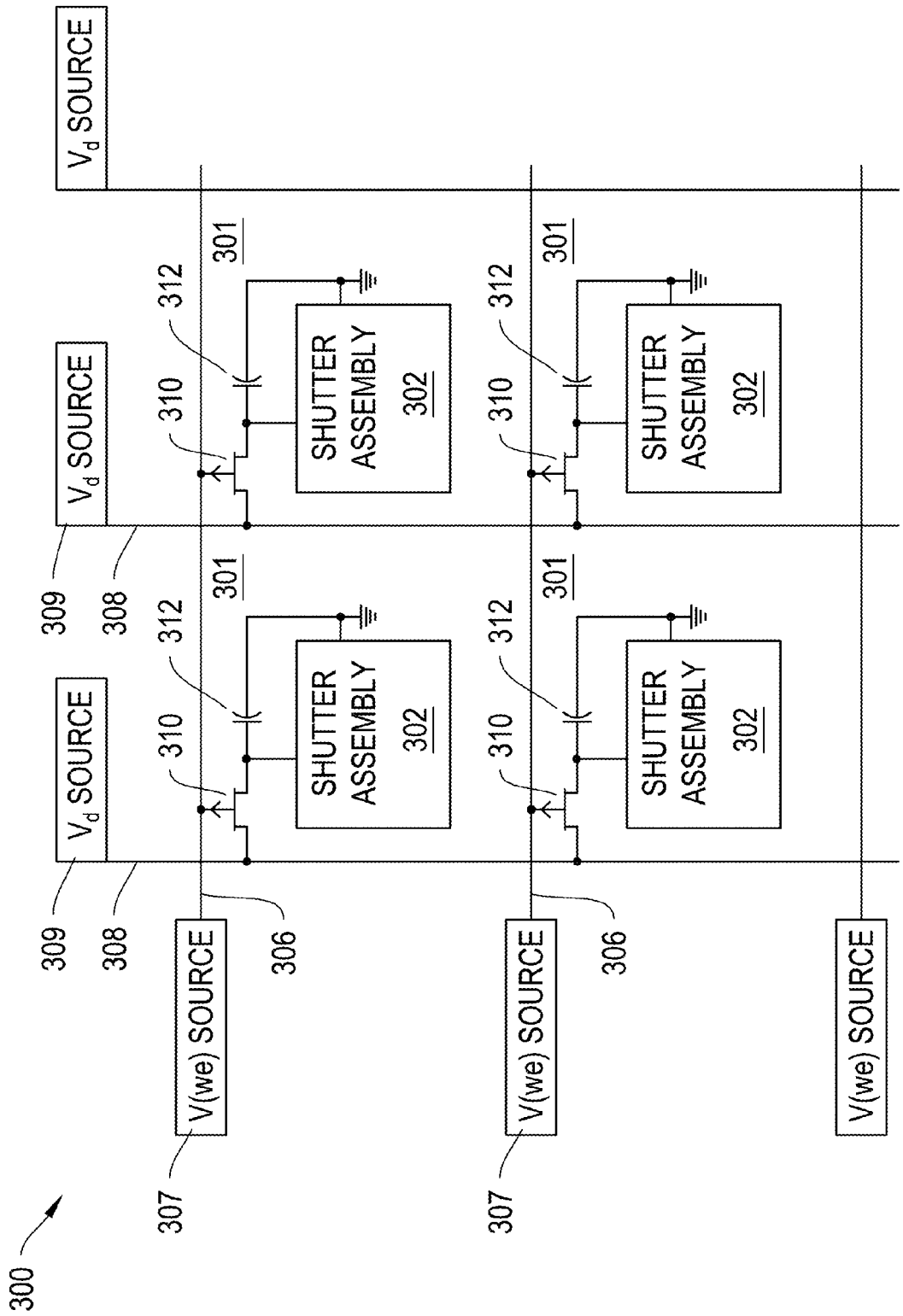
FIG. 3A shows an example schematic diagram of a control matrix.
Figure 3B:
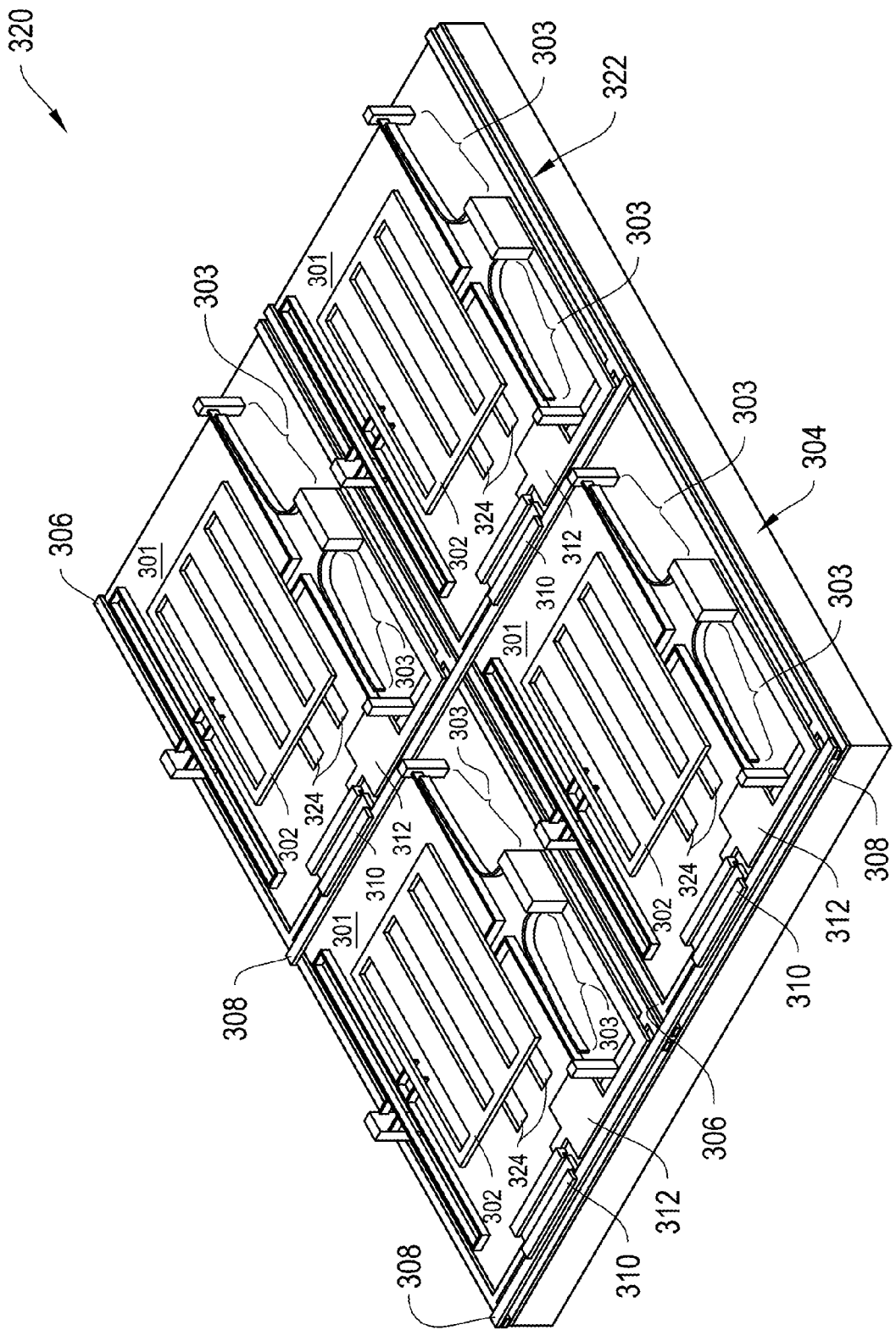
FIG. 3B shows an example perspective view of an array of shutter-based light modulators connected to the control matrix of FIG. 3A.

FIG. 3A shows an example schematic diagram of a control matrix 300. The control matrix 300 is suitable for controlling the light modulators incorporated into the MEMS-based display apparatus 100 of FIG. 1A. FIG. 3B shows a perspective view of an array 320 of shutter-based light modulators connected to the control matrix 300 of FIG. 3A. The control matrix 300 may address an array of pixels 320 (the "array 320"). Each pixel 301 can include an elastic shutter assembly 302, such as the shutter assembly 200 of FIG. 2, controlled by an actuator 303. Each pixel also can include an aperture layer 322 that includes apertures 324.

The control matrix 300 is fabricated as a diffused or thin-film-deposited electrical circuit on the surface of a substrate 304 on which the shutter assemblies 302 are formed. The control matrix 300 includes a scan-line interconnect 306 for each row of pixels 301 in the control matrix 300 and a data-interconnect 308 for each column of pixels 301 in the control matrix 300. Each scan-line interconnect 306 electrically connects a write-enabling voltage source 307 to the pixels 301 in a corresponding row of pixels 301. Each data interconnect 308 electrically connects a data voltage source 309 ("$V_d$ source") to the pixels 301 in a corresponding column of pixels. In the control matrix 300, the $V_d$ source 309 provides the majority of the energy to be used for actuation of the shutter assemblies 302. Thus, the data voltage source, $V_d$ source 309, also serves as an actuation voltage source.

Referring to FIGS. 3A and 3B, for each pixel 301 or for each shutter assembly 302 in the array of pixels 320, the control matrix 300 includes a transistor 310 and a capacitor 312. The gate of each transistor 310 is electrically connected to the scan-line interconnect 306 of the row in the array 320 in which the pixel 301 is located. The source of each transistor 310 is electrically connected to its corresponding data interconnect 308. The actuators 303 of each shutter assembly 302 include two electrodes. The drain of each transistor 310 is electrically connected in parallel to one electrode of the corresponding capacitor 312 and to one of the electrodes of the corresponding actuator 303. The other electrode of the capacitor 312 and the other electrode of the actuator 303 in shutter assembly 302 are connected to a common or ground potential. In alternate implementations, the transistors 310 can be replaced with semiconductor diodes and or metal-insulator-metal sandwich type switching elements.

In operation, to form an image, the control matrix 300 write-enables each row in the array 320 in a sequence by applying $V_{we}$ to each scan-line interconnect 306 in turn. For a write-enabled row, the application of $V_{we}$ to the gates of the transistors 310 of the pixels 301 in the row allows the flow of current through the data interconnects 308 through the transistors 310 to apply a potential to the actuator 303 of the shutter assembly 302. While the row is write-enabled, data voltages $V_d$ are selectively applied to the data interconnects 308. In implementations providing analog gray scale, the data voltage applied to each data interconnect 308 is varied in relation to the desired brightness of the pixel 301 located at the intersection of the write-enabled scan-line interconnect 306 and the data interconnect 308. In implementations providing digital control schemes, the data voltage is selected to be either a relatively low magnitude voltage (i.e., a voltage near ground) or to meet or exceed $V_{at}$ (the actuation threshold voltage). In response to the application of $V_{at}$ to a data interconnect 308, the actuator 303 in the corresponding shutter assembly actuates, opening the shutter in that shutter assembly 302. The voltage applied to the data interconnect 308 remains stored in the capacitor 312 of the pixel 301 even after the control matrix 300 ceases to apply $V_{we}$ to a row. Therefore, the voltage $V_{we}$ does not have to wait and hold on a row for times long enough for the shutter assembly 302 to actuate; such actuation can proceed after the write-enabling voltage has been removed from the row. The capacitors 312 also function as memory elements within the array 320, storing actuation instructions for the illumination of an image frame.

The pixels 301 as well as the control matrix 300 of the array 320 are formed on a substrate 304. The array 320 includes an aperture layer 322, disposed on the substrate 304, which includes a set of apertures 324 for respective pixels 301 in the array 320. The apertures 324 are aligned with the shutter assemblies 302 in each pixel. In some implementations, the substrate 304 is made of a transparent material, such as glass or plastic. In some other implementations, the substrate 304 is made of an opaque material, but in which holes are etched to form the apertures 324.

The shutter assembly 302 together with the actuator 303 can be made bi-stable. That is, the shutters can exist in at least two equilibrium positions (e.g., open or closed) with little or no power required to hold them in either position. More particularly, the shutter assembly 302 can be mechanically bi-stable. Once the shutter of the shutter assembly 302 is set in position, no electrical energy or holding voltage is required to maintain that position. The mechanical stresses on the physical elements of the shutter assembly 302 can hold the shutter in place.

The shutter assembly 302 together with the actuator 303 also can be made electrically bi-stable. In an electrically bi-stable shutter assembly, there exists a range of voltages below the actuation voltage of the shutter assembly, which if applied to a closed actuator (with the shutter being either open or closed), holds the actuator closed and the shutter in position, even if an opposing force is exerted on the shutter. The opposing force may be exerted by a spring such as the spring 207 in the shutter-based light modulator 200 depicted in FIG. 2A, or the opposing force may be exerted by an opposing actuator, such as an "open" or "closed" actuator.

The light modulator array 320 is depicted as having a single MEMS light modulator per pixel. Other implementations are possible in which multiple MEMS light modulators are provided in each pixel, thereby providing the possibility of more than just binary "on" or "off" optical states in each pixel. Certain forms of coded area division gray scale are possible where multiple MEMS light modulators in the pixel are provided, and where apertures 324, which are associated with each of the light modulators, have unequal areas.

FIGS. 4A and 4B show example views of a dual actuator shutter assembly 400. The dual actuator shutter assembly 400, as depicted in FIG. 4A, is in an open state. FIG. 4B shows the dual actuator shutter assembly 400 in a closed state. In contrast to the shutter assembly 200, the shutter assembly 400 includes actuators 402 and 404 on either side of a shutter 406. Each actuator 402 and 404 is independently controlled. A first actuator, a shutter-open actuator 402, serves to open the shutter 406. A second opposing actuator, the shutter-close actuator 404, serves to close the shutter 406. Both of the actuators 402 and 404 are compliant beam electrode actuators. The actuators 402 and 404 open and close the shutter 406 by driving the shutter 406 substantially in a plane parallel to an aperture layer 407 over which the shutter is suspended. The shutter 406 is suspended a short distance over the aperture layer 407 by anchors 408 attached to the actuators 402 and 404. The inclusion of supports attached to both ends of the shutter 406 along its axis of movement reduces out of plane motion of the shutter 406 and confines the motion substantially to a plane parallel to the substrate. By analogy to the control matrix 300 of FIG. 3A, a control matrix suitable for use with the shutter assembly 400 might include one transistor and one capacitor for each of the opposing shutter-open and shutter-close actuators 402 and 404.

The shutter 406 includes two shutter apertures 412 through which light can pass. The aperture layer 407 includes a set of three apertures 409. In FIG. 4A, the shutter assembly 400 is in the open state and, as such, the shutter-open actuator 402 has been actuated, the shutter-close actuator 404 is in its relaxed position, and the centerlines of the shutter apertures 412 coincide with the centerlines of two of the aperture layer apertures 409. In FIG. 4B, the shutter assembly 400 has been moved to the closed state and, as such, the shutter-open actuator 402 is in its relaxed position, the shutter-close actuator 404 has been actuated, and the light blocking portions of the shutter 406 are now in position to block transmission of light through the apertures 409 (depicted as dotted lines).

Each aperture has at least one edge around its periphery. For example, the rectangular apertures 409 have four edges. In alternative implementations in which circular, elliptical, oval, or other curved apertures are formed in the aperture layer 407, each aperture may have only a single edge. In some other implementations, the apertures need not be separated or disjoint in the mathematical sense, but instead can be connected. That is to say, while portions or shaped sections of the aperture may maintain a correspondence to each shutter, several of these sections may be connected such that a single continuous perimeter of the aperture is shared by multiple shutters.

In order to allow light with a variety of exit angles to pass through apertures 412 and 409 in the open state, it is advantageous to provide a width or size for shutter apertures 412 which is larger than a corresponding width or size of apertures 409 in the aperture layer 407. In order to effectively block light from escaping in the closed state, it is preferable that the light blocking portions of the shutter 406 overlap the apertures 409. FIG. 4B shows a predefined overlap 416 between the edge of light blocking portions in the shutter 406 and one edge of the aperture 409 formed in the aperture layer 407.

The electrostatic actuators 402 and 404 are designed so that their voltage-displacement behavior provides a bi-stable characteristic to the shutter assembly 400. For each of the shutter-open and shutter-close actuators there exists a range of voltages below the actuation voltage, which if applied while that actuator is in the closed state (with the shutter being either open or closed), will hold the actuator closed and the shutter in position, even after an actuation voltage is applied to the opposing actuator. The minimum voltage needed to maintain a shutter's position against such an opposing force is referred to as a maintenance voltage $V_m$.

Figure 5:
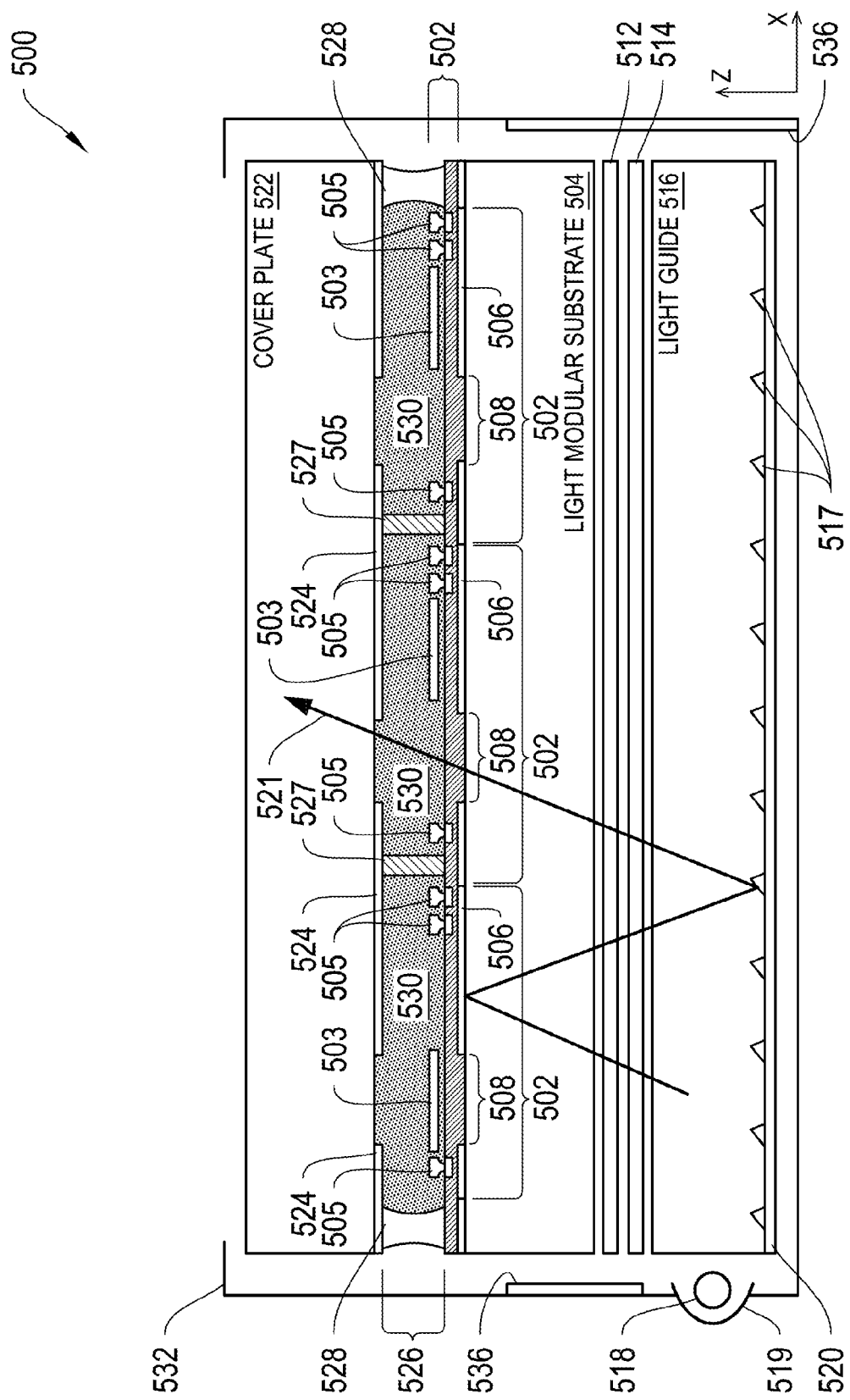
FIG. 5 shows an example cross sectional view of a display apparatus incorporating shutter-based light modulators.

FIG. 5 shows an example cross sectional view of a display apparatus 500 incorporating shutter-based light modulators (shutter assemblies) 502. Each shutter assembly 502 incorporates a shutter 503 and an anchor 505. Not shown are the compliant beam actuators which, when connected between the anchors 505 and the shutters 503, help to suspend the shutters 503 a short distance above the surface. The shutter assemblies 502 are disposed on a transparent substrate 504, such as made of plastic or glass. A rear-facing reflective aperture layer 506, disposed on the substrate 504, defines a plurality of surface apertures 508 located beneath the closed positions of the shutters 503 of the shutter assemblies 502. The reflective aperture layer 506 reflects light not passing through the surface apertures 508 back towards the rear of the display apparatus 500. The reflective aperture layer 506 can be a fine-grained metal film without inclusions formed in thin film fashion by a number of vapor deposition techniques including sputtering, evaporation, ion plating, laser ablation, or chemical vapor deposition (CVD). In some implementations, the reflective aperture layer 506 can be formed from a mirror, such as a dielectric mirror. A dielectric mirror can be fabricated as a stack of dielectric thin films which alternate between materials of high and low refractive index. The vertical gap which separates the shutters 503 from the reflective aperture layer 506, within which the shutter is free to move, is in the range of 0.5 to 10 microns. The magnitude of the vertical gap is preferably less than the lateral overlap between the edge of shutters 503 and the edge of apertures 508 in the closed state, such as the overlap 416 depicted in FIG. 4B.

The display apparatus 500 includes an optional diffuser 512 and/or an optional brightness enhancing film 514 which separate the substrate 504 from a planar light guide 516. The light guide 516 includes a transparent, i.e., glass or plastic material. The light guide 516 is illuminated by one or more light sources 518, forming a backlight 515. The light sources 518 can be, for example, and without limitation, incandescent lamps, fluorescent lamps, lasers or light emitting diodes (LEDs) (generically referred to as "lamps"). A reflector 519 helps direct light from light source 518 towards the light guide 516. A front-facing reflective film 520 is disposed behind the backlight 515, reflecting light towards the shutter assemblies 502. Light rays, such as ray 521 from the backlight 515 that do not pass through one of the shutter assemblies 502, will be returned to the backlight 515 and reflected again from the film 520. In this fashion light that fails to leave the display apparatus 500 to form an image on the first pass can be recycled and made available for transmission through other open apertures in the array of shutter assemblies 502. Such light recycling has been shown to increase the illumination efficiency of the display.

The light guide 516 includes a set of geometric light redirectors or prisms 517 which re-direct light from the light source 518 towards the apertures 508 and hence toward the front of the display apparatus 500. The light redirectors 517 can be molded into the plastic body of the light guide 516 with shapes that can be alternately triangular, trapezoidal, or curved in cross section. The density of the prisms 517 generally increases with distance from the light source 518.

In some implementations, the aperture layer 506 can be made of a light absorbing material, and in alternate implementations the surfaces of shutter 503 can be coated with either a light absorbing or a light reflecting material. In some other implementations, the aperture layer 506 can be deposited directly on the surface of the light guide 516. In some implementations, the aperture layer 506 need not be disposed on the same substrate as the shutters 503 and anchors 505 (such as in the MEMS-down configuration described below).

In some implementations, the light source 518 can include lamps of different colors, for instance, the colors red, green and blue. A color image can be formed by sequentially illuminating images with lamps of different colors at a rate sufficient for the human brain to average the different colored images into a single multi-color image. The various color-specific images are formed using the array of shutter assemblies 502. In another implementation, the light source 518 includes lamps having more than three different colors. For example, the light source 518 may have red, green, blue and white lamps, or red, green, blue and yellow lamps. In some other implementations, the light source 518 may include cyan, magenta, yellow and white lamps, red, green, blue and white lamps. In some other implementations, additional lamps may be included in the light source 518. For example, if using five colors, the light source 518 may include red, green, blue, cyan and yellow lamps. In some other implementations, the light source 518 may include white, orange, blue, purple and green lamps or white, blue, yellow, red and cyan lamps. If using six colors, the light source 518 may include red, green, blue, cyan, magenta and yellow lamps or white, cyan, magenta, yellow, orange and green lamps.

A cover plate 522 forms the front of the display apparatus 500. The rear side of the cover plate 522 can be covered with a black matrix 524 to increase contrast. In alternate implementations the cover plate includes color filters, for instance distinct red, green, and blue filters corresponding to different ones of the shutter assemblies 502. The cover plate 522 is supported a predetermined distance away from the shutter assemblies 502 forming a gap 526. The gap 526 is maintained by mechanical supports or spacers 527 and/or by an adhesive seal 528 attaching the cover plate 522 to the substrate 504.

The adhesive seal 528 seals in a fluid 530. The fluid 530 is engineered with viscosities preferably below about 10 centipoise and with relative dielectric constant preferably above about 2.0, and dielectric breakdown strengths above about $10^4$ V/cm. The fluid 530 also can serve as a lubricant. In some implementations, the fluid 530 is a hydrophobic liquid with a high surface wetting capability. In alternate implementations, the fluid 530 has a refractive index that is either greater than or less than that of the substrate 504.

Displays that incorporate mechanical light modulators can include hundreds, thousands, or in some cases, millions of moving elements. In some devices, every movement of an element provides an opportunity for static friction to disable one or more of the elements. This movement is facilitated by immersing all the parts in a fluid (also referred to as fluid 530) and sealing the fluid (e.g., with an adhesive) within a fluid space or gap in a MEMS display cell. The fluid 530 is usually one with a low coefficient of friction, low viscosity, and minimal degradation effects over the long term. When the MEMS-based display assembly includes a liquid for the fluid 530, the liquid at least partially surrounds some of the moving parts of the MEMS-based light modulator. In some implementations, in order to reduce the actuation voltages, the liquid has a viscosity below 70 centipoise. In some other implementations, the liquid has a viscosity below 10 centipoise. Liquids with viscosities below 70 centipoise can include materials with low molecular weights: below 4000 grams/mole, or in some cases below 400 grams/mole. Fluids 530 that also may be suitable for such implementations include, without limitation, de-ionized water, methanol, ethanol and other alcohols, paraffins, olefins, ethers, silicone oils, fluorinated silicone oils, or other natural or synthetic solvents or lubricants. Useful fluids can be polydimethylsiloxanes (PDMS), such as hexamethyldisiloxane and octamethyltrisiloxane, or alkyl methyl siloxanes such as hexylpentamethyldisiloxane. Useful fluids can be alkanes, such as octane or decane. Useful fluids can be nitroalkanes, such as nitromethane. Useful fluids can be aromatic compounds, such as toluene or diethylbenzene. Useful fluids can be ketones, such as butanone or methyl isobutyl ketone. Useful fluids can be chlorocarbons, such as chlorobenzene. Useful fluids can be chlorofluorocarbons, such as dichlorofluoroethane or chlorotrifluoroethylene. Other fluids considered for these display assemblies include butyl acetate and dimethylformamide. Still other useful fluids for these displays include hydro fluoro ethers, perfluoropolyethers, hydro fluoro poly ethers, pentanol, and butanol. Example suitable hydro fluoro ethers include ethyl nonafluorobutyl ether and 2-trifluoromethyl-3-ethoxydodecafluorohexane.

A sheet metal or molded plastic assembly bracket 532 holds the cover plate 522, the substrate 504, the backlight 515 and the other component parts together around the edges. The assembly bracket 532 is fastened with screws or indent tabs to add rigidity to the combined display apparatus 500. In some implementations, the light source 518 is molded in place by an epoxy potting compound. Reflectors 536 help return light escaping from the edges of the light guide 516 back into the light guide 516. Not depicted in FIG. 5 are electrical interconnects which provide control signals as well as power to the shutter assemblies 502 and the light source 518.

The display apparatus 500 is referred to as the MEMS-up configuration, wherein the MEMS-based light modulators are formed on a front surface of the substrate 504, i.e., the surface that faces toward the viewer. The shutter assemblies 502 are built directly on top of the reflective aperture layer 506. In an alternate implementation, referred to as the MEMS-down configuration, the shutter assemblies are disposed on a substrate separate from the substrate on which the reflective aperture layer is formed. The substrate on which the reflective aperture layer is formed, defining a plurality of apertures, is referred to herein as the aperture plate. In the MEMS-down configuration, the substrate that carries the MEMS-based light modulators takes the place of the cover plate 522 in the display apparatus 500 and is oriented such that the MEMS-based light modulators are positioned on the rear surface of the top substrate, i.e., the surface that faces away from the viewer and toward the light guide 516. The MEMS-based light modulators are thereby positioned directly opposite to and across a gap from the reflective aperture layer 506. The gap can be maintained by a series of spacer posts connecting the aperture plate and the substrate on which the MEMS modulators are formed. In some implementations, the spacers are disposed within or between each pixel in the array. The gap or distance that separates the MEMS light modulators from their corresponding apertures is preferably less than 10 microns, or a distance that is less than the overlap between shutters and apertures, such as overlap 416.

Figure 6A:
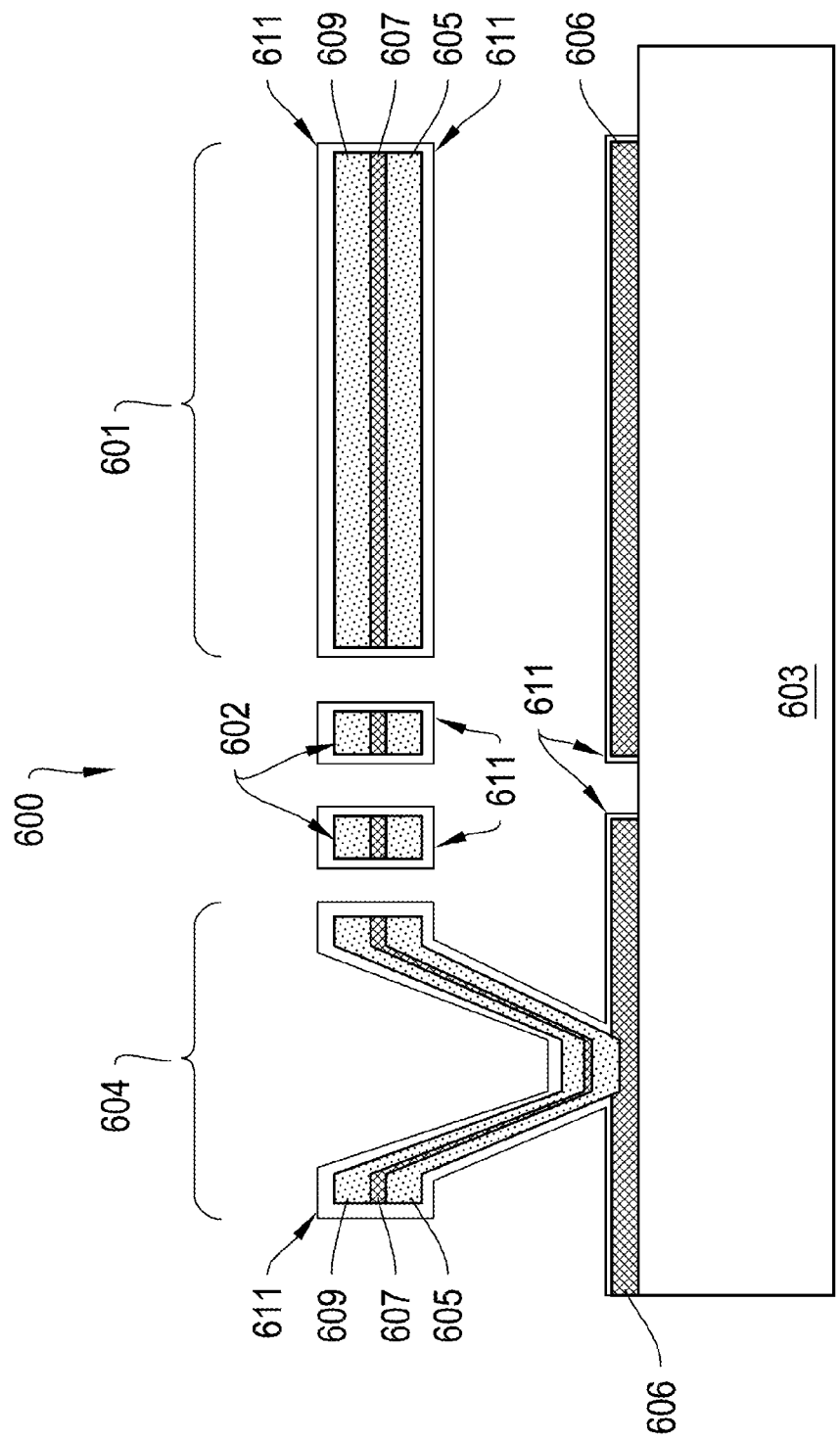
FIGS. 6A-6E show cross sectional views of stages of construction of an example composite shutter assembly.

FIGS. 6A-6E show cross sectional views of stages of construction of an example composite shutter assembly. FIG. 6A shows an example cross sectional diagram of a completed composite shutter assembly 600. The shutter assembly 600 includes a shutter 601, two compliant beams 602, and an anchor structure 604 built-up on a substrate 603 and an aperture layer 606. The elements of the composite shutter assembly 600 include a first mechanical layer 605, a conductor layer 607, a second mechanical layer 609, and an encapsulating dielectric 611. At least one of the mechanical layers 605 or 609 can be deposited to thicknesses in excess of 0.15 microns, as one or both of the mechanical layers 605 or 609 serves as the principal load bearing and mechanical actuation member for the shutter assembly 600, though in some implementations, the mechanical layers 605 and 609 may be thinner. Candidate materials for the mechanical layers 605 and 609 include, without limitation, metals such as aluminum (Al), copper (Cu), nickel (Ni), chromium (Cr), molybdenum (Mo), titanium (Ti), tantalum (Ta), niobium (Nb), neodymium (Nd), or alloys thereof; dielectric materials such as aluminum oxide ($Al_2O_3$), silicon oxide ($SiO_2$), tantalum pentoxide ($Ta_2O_5$), or silicon nitride ($Si_3N_4$); or semiconducting materials such as diamond-like carbon, silicon (Si), germanium (Ge), gallium arsenide (GaAs), cadmium telluride (CdTe) or alloys thereof. At least one of the layers, such as the conductor layer 607, should be electrically conducting so as to carry charge on to and off of the actuation elements. Candidate materials include, without limitation, Al, Cu, Ni, Cr, Mo, Ti, Ta, Nb, Nd, or alloys thereof or semiconducting materials such as diamond-like carbon, Si, Ge, GaAs, CdTe or alloys thereof. In some implementations employing semiconductor layers, the semiconductors are doped with impurities such as phosphorus (P), arsenic (As), boron (B), or Al. FIG. 6A depicts a sandwich configuration for the composite in which the mechanical layers 605 and 609, having similar thicknesses and mechanical properties, are deposited on either side of the conductor layer 607. In some implementations, the sandwich structure helps to ensure that stresses remaining after deposition and/or stresses that are imposed by temperature variations will not act to cause bending, warping or other deformation of the shutter assembly 600.

In some implementations, the order of the layers in the composite shutter assembly 600 can be inverted, such that the outside of the shutter assembly 600 is formed from a conductor layer while the inside of the shutter assembly 600 is formed from a mechanical layer.

The shutter assembly 600 can include an encapsulating dielectric 611. In some implementations, dielectric coatings can be applied in conformal fashion, such that all exposed bottom, top, and side surfaces of the shutter 601, the anchor 604, and the beams 602 are uniformly coated. Such thin films can be grown by thermal oxidation and/or by conformal CVD of an insulator such as $Al_2O_3$, chromium (III) oxide ($Cr_2O_3$), titanium oxide ($TiO_2$), hafnium oxide ($HfO_2$), vanadium oxide ($V_2O_5$), niobium oxide ($Nb_2O_5$), $Ta_2O_5$, $SiO_2$, or $Si_3N_4$, or by depositing similar materials via atomic layer deposition. The dielectric coating layer can be applied with thicknesses in the range of 10 nm to 1 micron. In some implementations, sputtering and evaporation can be used to deposit the dielectric coating onto sidewalls.

FIGS. 6B-6E show example cross sectional views of the results of certain intermediate manufacturing stages of an example process used to form the shutter assembly 600 depicted in FIG. 6A. In some implementations, the shutter assembly 600 is built on top of a pre-existing control matrix, such as an active matrix array of thin film transistors, such as the control matrices depicted in FIGS. 3A and 3B.

Figure 6B:
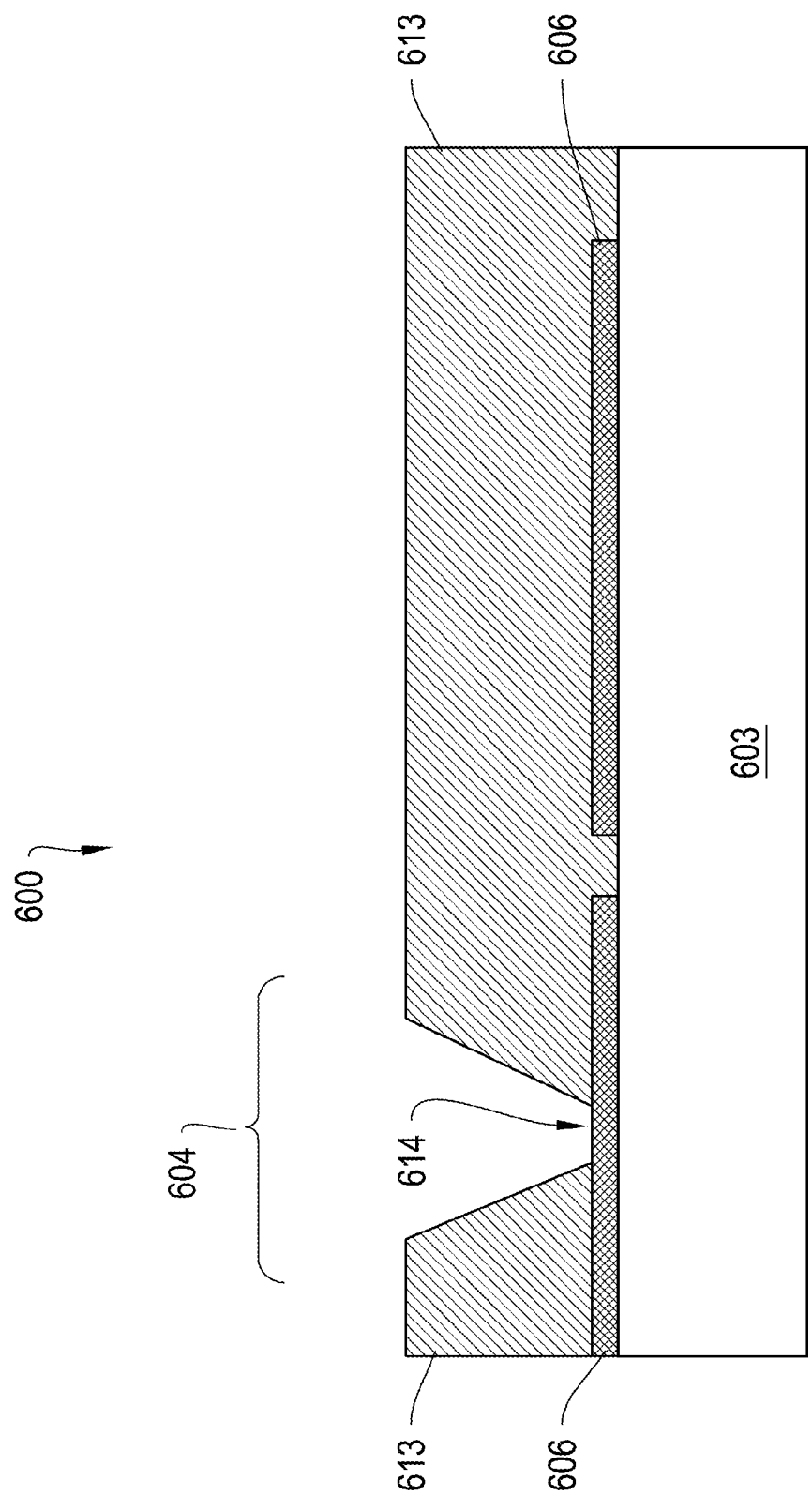

FIG. 6B shows a cross sectional view of the results of a first stage in an example process of forming the shutter assembly 600. As depicted in FIG. 6B, a sacrificial layer 613 is deposited and patterned. In some implementations, polyimide is used as a sacrificial layer material. Other candidate sacrificial layer materials include, without limitation, polymer materials such as polyamide, fluoropolymer, benzocyclobutene, polyphenylquinoxylene, parylene, or polynorbornene. These materials are chosen for their ability to planarize rough surfaces, maintain mechanical integrity at processing temperatures in excess of 250° C., and their ease of etch and/or thermal decomposition during removal. In other implementations, the sacrificial layer 613 is formed from a photoresist, such as polyvinyl acetate, polyvinyl ethylene, and phenolic or novolac resins. An alternate sacrificial layer material used in some implementations is $SiO_2$, which can be removed preferentially as long as other electronic or structural layers are resistant to the hydrofluoric acid solutions used for its removal. One such suitable resistant material is $Si_3N_4$. Another alternate sacrificial layer material is Si, which can be removed preferentially as long as electronic or structural layers are resistant to the fluorine plasmas or xenon difluoride ($XeF_2$) used for its removal, such as most metals and $Si_3N_4$. Yet another alternate sacrificial layer material is Al, which can be removed preferentially as long as other electronic or structural layers are resistant to strong base solutions, such as concentrated sodium hydroxide (NaOH) solutions. Suitable materials include, for example, Cr, Ni, Mo, Ta and Si. Still another alternate sacrificial layer material is Cu, which can be removed preferentially as long as other electronic or structural layers are resistant to nitric or sulfuric acid solutions. Such materials include, for example, Cr, Ni, and Si.

Next the sacrificial layer 613 is patterned to expose holes or vias at the anchor regions 604. In implementations employing polyimide or other non-photoactive materials as the sacrificial layer material, the sacrificial layer material can be formulated to include photoactive agents, allowing regions exposed through a UV photomask to be preferentially removed in a developer solution. Sacrificial layers formed from other materials can be patterned by coating the sacrificial layer 613 in an additional layer of photoresist, photopatterning the photoresist, and finally using the photoresist as an etching mask. The sacrificial layer 613 alternatively can be patterned by coating the sacrificial layer 613 with a hard mask, which can be a thin layer of $SiO_2$ or a metal such as Cr. A photopattern is then transferred to the hard mask by way of photoresist and wet chemical etching. The pattern developed in the hard mask can be resistant to dry chemical, anisotropic, or plasma etching—techniques which can be used to impart deep and narrow anchor holes into the sacrificial layer 613.

After the anchor regions 604 have been opened in the sacrificial layer 613, the exposed and underlying conducting surface 614 can be etched, either chemically or via the sputtering effects of a plasma, to remove any surface oxide layers. Such a contact etching stage can improve the ohmic contact between the underlying conducting surface 614 and the shutter material. After patterning of the sacrificial layer 613, any photoresist layers or hard masks can be removed through use of either solvent cleaning or acid etching.

Figure 6C:
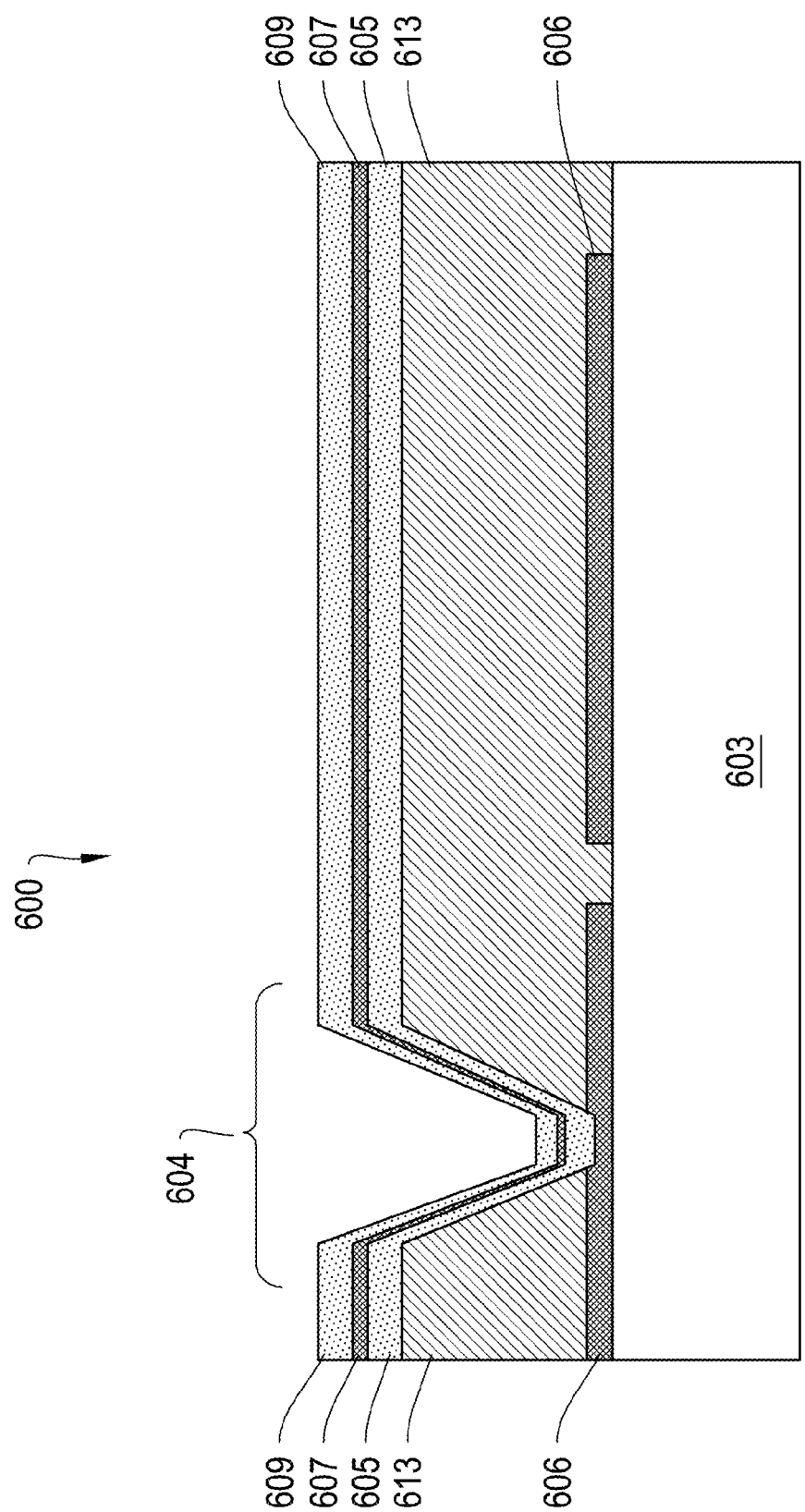

Next, in the process for building the shutter assembly 600, as depicted in FIG. 6C, the shutter materials are deposited. The shutter assembly 600 is composed of multiple thin films: the first mechanical layer 605, the conductor layer 607 and the second mechanical layer 609. In some implementations, the first mechanical layer 605 is an amorphous silicon (a-Si) layer, the conductor layer 607 is Al and the second mechanical layer 609 is a-Si. The first mechanical layer 605, the conductor layer 607, and the second mechanical layer 609 are deposited at a temperature which is below that at which physical degradation occurs for the sacrificial layer 613. For instance, polyimide decomposes at temperatures above about 400° C. Therefore, in some implementations, the first mechanical layer 605, the conductor layer 607 and the second mechanical layer 609 are deposited at temperatures below about 400° C., allowing usage of polyimide as a sacrificial layer material. In some implementations, hydrogenated amorphous silicon (a-Si:H) is a useful mechanical material for the first and second mechanical layers 605 and 609 since it can be grown to thicknesses in the range of about 0.15 to about 3 microns, in a relatively stress-free state, by way of plasma-enhanced chemical vapor deposition (PECVD) from silane gas at temperatures in the range of about 250 to about 350° C. In some of such implementations, phosphine gas ($PH_3$) is used as a dopant so that the a-Si can be grown with resistivities below about 1 ohm-cm. In alternate implementations, a similar PECVD technique can be used for the deposition of $Si_3N_4$, silicon-rich $Si_3N_4$, or $SiO_2$ materials as the first mechanical layer 605 or for the deposition of diamond-like carbon, Ge, SiGe, CdTe, or other semiconducting materials for the first mechanical layer 605. An advantage of the PECVD deposition technique is that the deposition can be quite conformal, that is, it can coat a variety of inclined surfaces or the inside surfaces of narrow via holes. Even if the anchor or via holes which are cut into the sacrificial layer material present nearly vertical sidewalls, the PECVD technique can provide a substantially continuous coating between the bottom and top horizontal surfaces of the anchor.

In addition to the PECVD technique, alternate suitable techniques available for the growth of the first and second mechanical layers 605 and 609 include RF or DC sputtering, metal-organic CVD, evaporation, electroplating or electroless plating.

For the conductor layer 607, in some implementations, a metal thin film, such as Al, is utilized. In some other implementations, alternative metals, such as Cu, Ni, Mo, or Ta can be chosen. The inclusion of such a conducting material serves two purposes. It reduces the overall sheet resistance of the shutter 601, and it helps to block the passage of visible light through the shutter 601, since a-Si, if less than about 2 microns thick, as may be used in some implementations of the shutter 601, can transmit visible light to some degree. The conducting material can be deposited either by sputtering or, in a more conformal fashion, by CVD techniques, electroplating, or electroless plating.

Figure 6D:
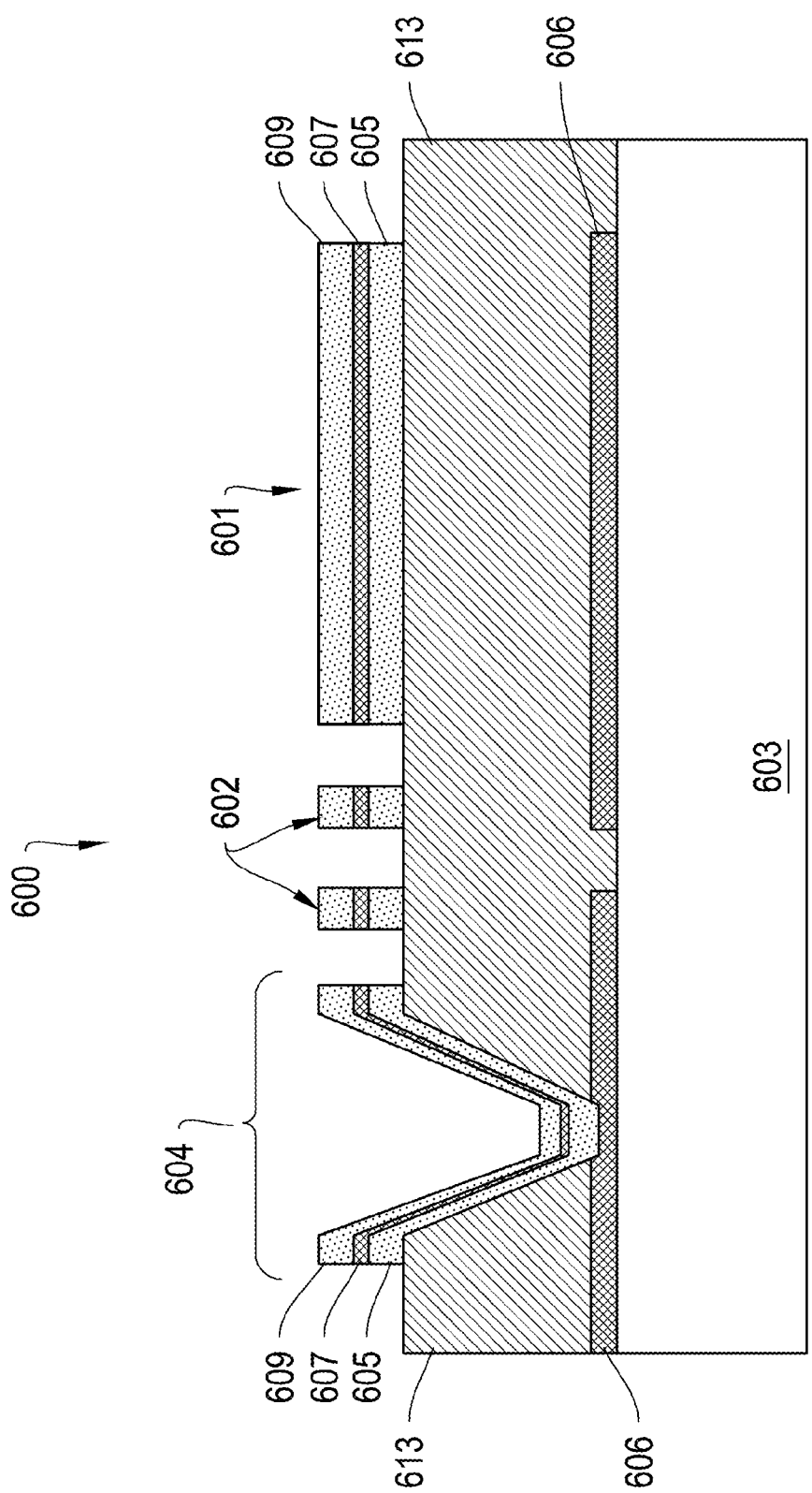

FIG. 6D shows the results of the next set of processing stages used in the formation of the shutter assembly 600. The first mechanical layer 605, the conductor layer 607, and the second mechanical layer 609 are photomasked and etched while the sacrificial layer 613 is still on the substrate 603. First, a photoresist material is applied, then exposed through a photomask, and then developed to form an etch mask. Amorphous silicon, $Si_3N_4$, and $SiO_2$ can then be etched in fluorine-based plasma chemistries. $SiO_2$ mechanical layers also can be etched using HF wet chemicals; and any metals in the conductor layer 607 can be etched with either wet chemicals or chlorine-based plasma chemistries.

The pattern shapes applied through the photomask can influence the mechanical properties, such as stiffness, compliance, and the voltage response in the actuator and shutter 601 of the shutter assembly 600. The shutter assembly 600 includes the compliant beams 602, shown in cross section. Each compliant beam 602 is shaped such that the width is less than the total height or thickness of the shutter material. In some implementations, the beam dimensional ratio is maintained at about 1.4:1 or greater, with the compliant beams 602 being taller or thicker than they are wide.

Figure 6E:
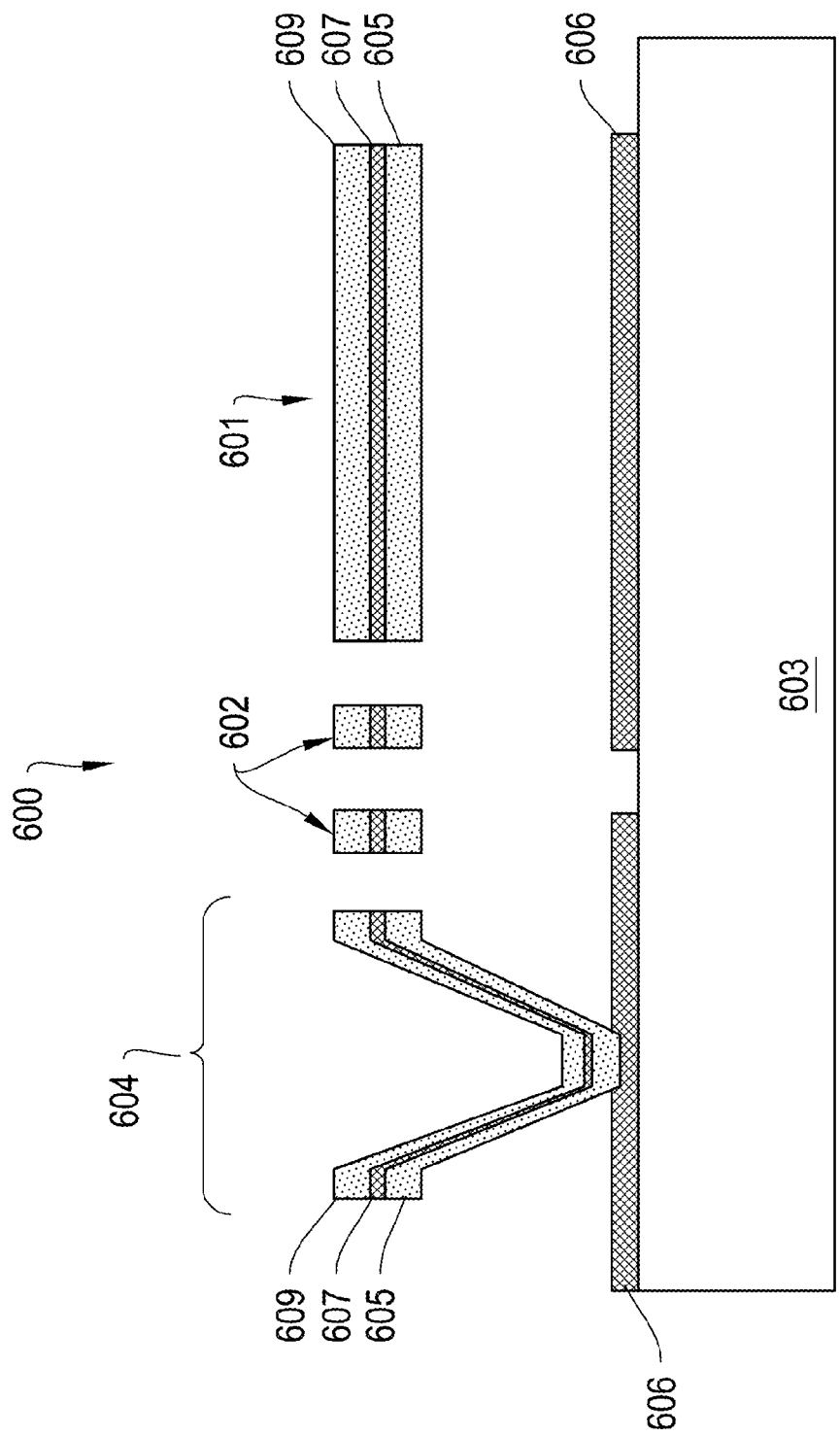

The results of subsequent stages of the example manufacturing process for building the shutter assembly 600 are depicted in FIG. 6E. The sacrificial layer 613 is removed, which frees-up all moving parts from the substrate 603, except at the anchor points. In some implementations, polyimide sacrificial materials are removed in an oxygen plasma. Other polymer materials used for the sacrificial layer 613 also can be removed in an oxygen plasma, or in some cases by thermal pyrolysis. Some sacrificial layer materials (such as $SiO_2$) can be removed by wet chemical etching or by vapor phase etching.

In a final process, the results of which are depicted in FIG. 6A, the encapsulating dielectric 611 is deposited on all exposed surfaces of the shutter assembly 600. In some implementations, the encapsulating dielectric 611 can be applied in a conformal fashion, such that all bottom, top, and side surfaces of the shutter 601 and the beams 602 are uniformly coated using CVD. In some other implementations, only the top and side surfaces of the shutter 601 are coated. In some implementations, $Al_2O_3$ is used for the encapsulating dielectric 611 and is deposited by atomic layer deposition to thicknesses in the range of about 10 to about 100 nanometers.

Finally, anti-stiction coatings can be applied to the surfaces of the shutter 601 and the beams 602. These coatings prevent the unwanted stickiness or adhesion between two independent beams of an actuator. Suitable coatings include carbon films (both graphite and diamond-like) as well as fluoropolymers, and/or low vapor pressure lubricants, as well as chlorosilanes, hydrocarbon chlorosilanes, fluorocarbon chlorosilanes, such as methoxy-terminated silanes, perfluoronated, amino-silanes, siloxanes and carboxylic acid based monomers and species. These coatings can be applied by either exposure to a molecular vapor or by decomposition of precursor compounds by way of CVD. Anti-stiction coatings also can be created by the chemical alteration of shutter surfaces, such as by fluoridation, silanization, siloxidation, or hydrogenation of insulating surfaces.

One class of suitable actuators for use in MEMS-based shutter displays include compliant actuator beams for controlling shutter motion that is transverse to or in-the-plane of the display substrate. The voltage employed for the actuation of such shutter assemblies decreases as the actuator beams become more compliant. The control of actuated motion also improves if the beams are shaped such that in-plane motion is preferred or promoted with respect to out-of-plane motion. Thus, in some implementations, the compliant actuator beams have a rectangular cross section, such that the beams are taller or thicker than they are wide.

The stiffness of a long rectangular beam with respect to bending within a particular plane scales with the thinnest dimension of that beam in that plane to the third power. It is therefore advantageous to reduce the width of the compliant beams to reduce the actuation voltages for in-plane motion. When using conventional photolithography equipment to define and fabricate the shutter and actuator structures, however, the minimum width of the beams can be limited to the resolution of the optics. And although photolithography equipment has been developed for defining patterns in photoresist with narrow features, such equipment is expensive, and the areas over which patterning can be accomplished in a single exposure are limited. For economical photolithography over large panels of glass or other transparent substrates, the patterning resolution or minimum feature size is typically limited to several microns.

FIGS. 7A-7D show isometric views of stages of construction of an example shutter assembly 700 with narrow sidewall beams. This alternate process yields compliant actuator beams 718 and 720 and a compliant spring beam 716 (collectively referred to as "sidewall beams 716, 718 and 720"), which have a width well below the conventional lithography limits on large glass panels. In the process depicted in FIGS. 7A-7D, the compliant beams of shutter assembly 700 are formed as sidewall features on a mold made from a sacrificial material. The process is referred to as a sidewall beams process.

Figure 7A:
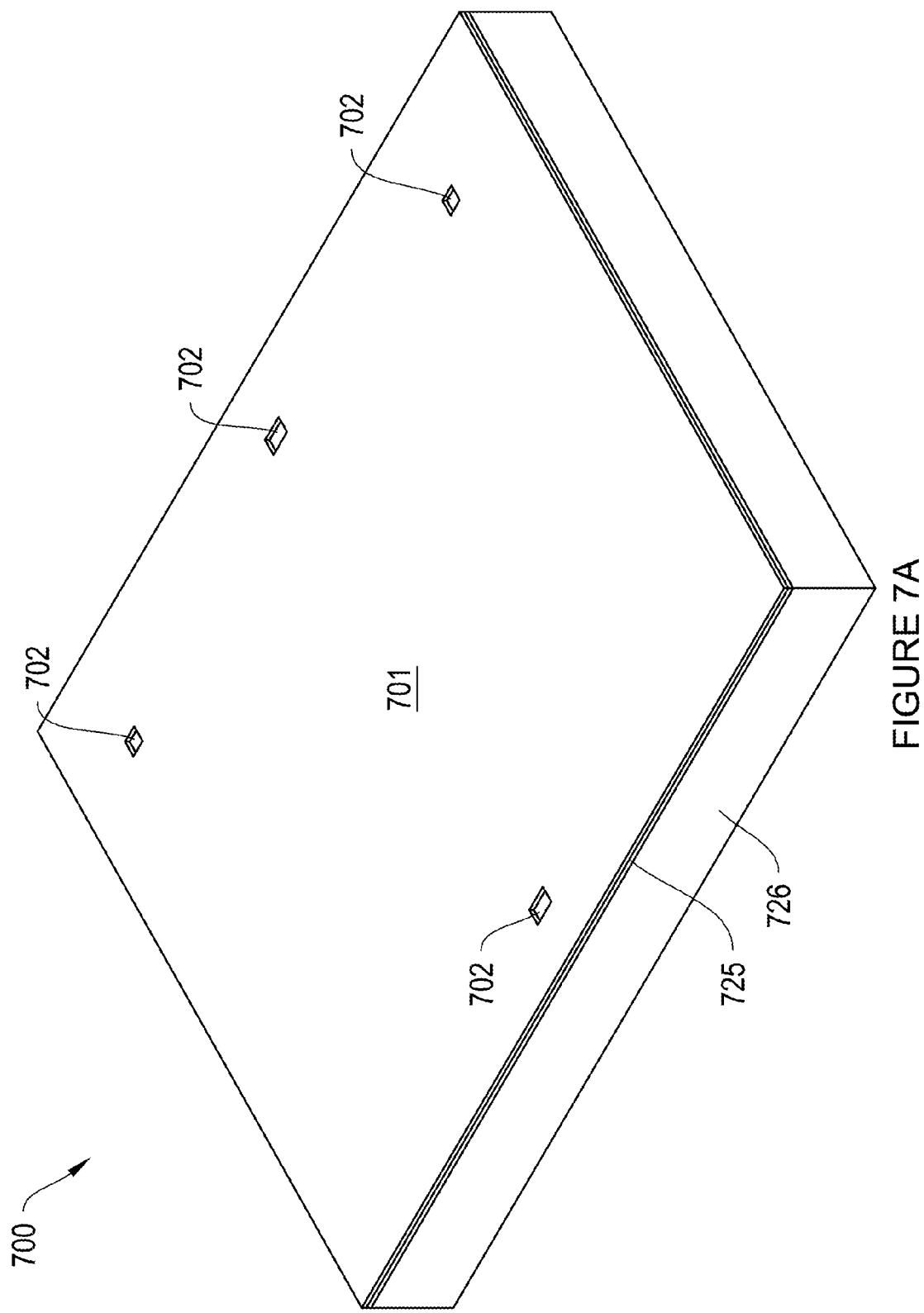
FIGS. 7A-7D show isomeric views of stages of construction of an example shutter assembly with narrow sidewall beams.

The process of forming the shutter assembly 700 with the sidewall beams 716, 718 and 720 begins, as depicted in FIG. 7A, with the deposition and patterning of a first sacrificial material 701. The pattern defined in the first sacrificial material 701 creates openings or vias 702 within which anchors for the shutter assembly 700 eventually will be formed. The deposition and patterning of the first sacrificial material 701 is similar in concept, and uses similar materials and techniques, as those described for the deposition and patterning described in relation to FIGS. 6A-6E.

Figure 7B:
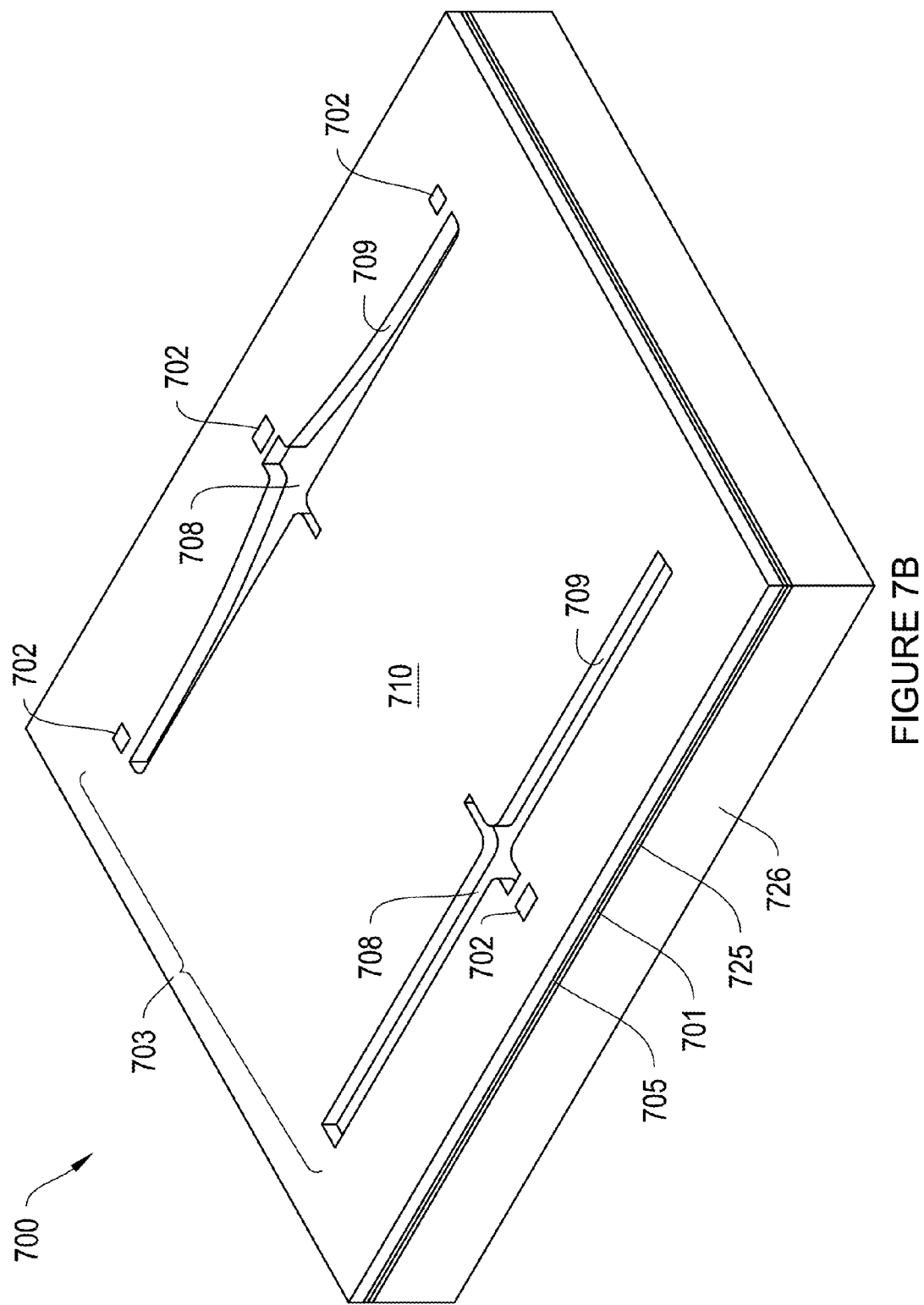

The process of forming the sidewall beams 716, 718 and 720 continues with the deposition and patterning of a second sacrificial material 705. FIG. 7B shows the shape of a mold 703 that is created after patterning of the second sacrificial material 705. The mold 703 also includes the first sacrificial material 701 with its previously defined vias 702. The mold 703 in FIG. 7B includes two distinct horizontal levels. The bottom horizontal level 708 of the mold 703 is established by the top surface of the first sacrificial layer 701 and is accessible in those areas where the second sacrificial material 705 has been etched away. The top horizontal level 710 of the mold 703 is established by the top surface of the second sacrificial material 705. The mold 703 depicted in FIG. 7B also includes substantially vertical sidewalls 709. Materials for use as the first and second sacrificial materials 701 and 705 are described above with respect to the sacrificial layer 613 of FIGS. 6A-6E.

Figure 7C:
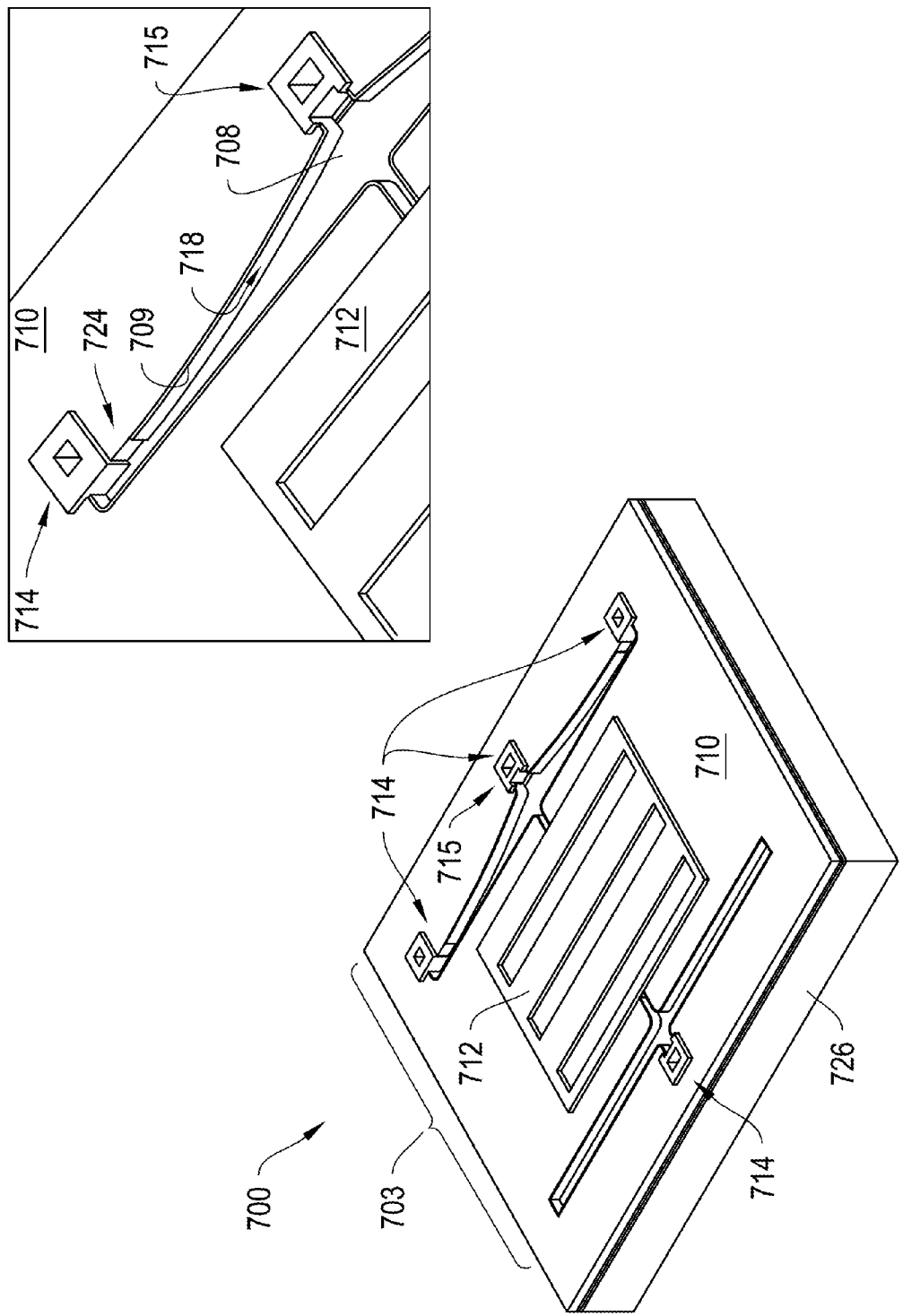

The process of forming the sidewall beams 716, 718 and 720 continues with the deposition and patterning of shutter material onto all of the exposed surfaces of the sacrificial mold 703, as depicted in FIG. 7C. Suitable materials for use in forming the shutter 712 are described above with respect to the first mechanical layer 605, the conductor layer 607, and the second mechanical layer 609 of FIGS. 6A-6E. The shutter material is deposited to a thickness of less than about 2 microns. In some implementations, the shutter material is deposited to have a thickness of less than about 1.5 microns. In some other implementations, the shutter material is deposited to have a thickness of less than about 1.0 microns, and as thin as about 0.10 microns. After deposition, the shutter material (which may be a composite of several materials as described above) is patterned, as depicted in FIG. 7C. First, a photoresist is deposited on the shutter material. The photoresist is then patterned. The pattern developed into the photoresist is designed such that the shutter material, after a subsequent etch stage, remains in the region of the shutter 712 as well as at the anchors 714.

The manufacturing process continues with applying an anisotropic etch, resulting in the structure depicted in FIG. 7C. The anisotropic etch of the shutter material is carried out in a plasma atmosphere with a voltage bias applied to the substrate 726 or to an electrode in proximity to the substrate 726. The biased substrate 726 (with electric field perpendicular to the surface of the substrate 726) leads to acceleration of ions toward the substrate 726 at an angle nearly perpendicular to the substrate 726. Such accelerated ions, coupled with the etching chemicals, lead to etch rates that are much faster in a direction that is normal to the plane of the substrate 726 as compared to directions parallel to the substrate 726. Undercut-etching of shutter material in the regions protected by a photoresist is thereby substantially eliminated. Along the vertical sidewalls 709 of the mold 703, which are substantially parallel to the track of the accelerated ions, the shutter material also is substantially protected from the anisotropic etch. Such protected sidewall shutter material form the sidewall beams 716, 718, and 720 for supporting the shutter 712. Along other (non-photoresist-protected) horizontal surfaces of the mold 703, such as the top horizontal surface 710 or the bottom horizontal surface 708, the shutter material has been substantially completely removed by the etch.

The anisotropic etch used to form the sidewall beams 716, 718 and 720 can be achieved in either an RF or DC plasma etching device as long as provision for electrical bias of the substrate 726 or of an electrode in close proximity of the substrate 726 is supplied. For the case of RF plasma etching, an equivalent self-bias can be obtained by disconnecting the substrate holder from the grounding plates of the excitation circuit, thereby allowing the substrate potential to float in the plasma. In some implementations, it is possible to provide an etching gas such as trifluoromethane ($CHF_3$), perfluorobutene ($C_4F_8$), or chloroform ($CHCl_3$) in which both carbon and hydrogen and/or carbon and fluorine are constituents in the etch gas. When coupled with a directional plasma, achieved again through voltage biasing of the substrate 726, the liberated carbon (C), hydrogen (H), and/or fluorine (F) atoms can migrate to the vertical sidewalls 709 where they build up a passive or protective quasi-polymer coating. This quasi-polymer coating further protects the sidewall beams 716, 718 and 720 from etching or chemical attack.

Figure 7D:
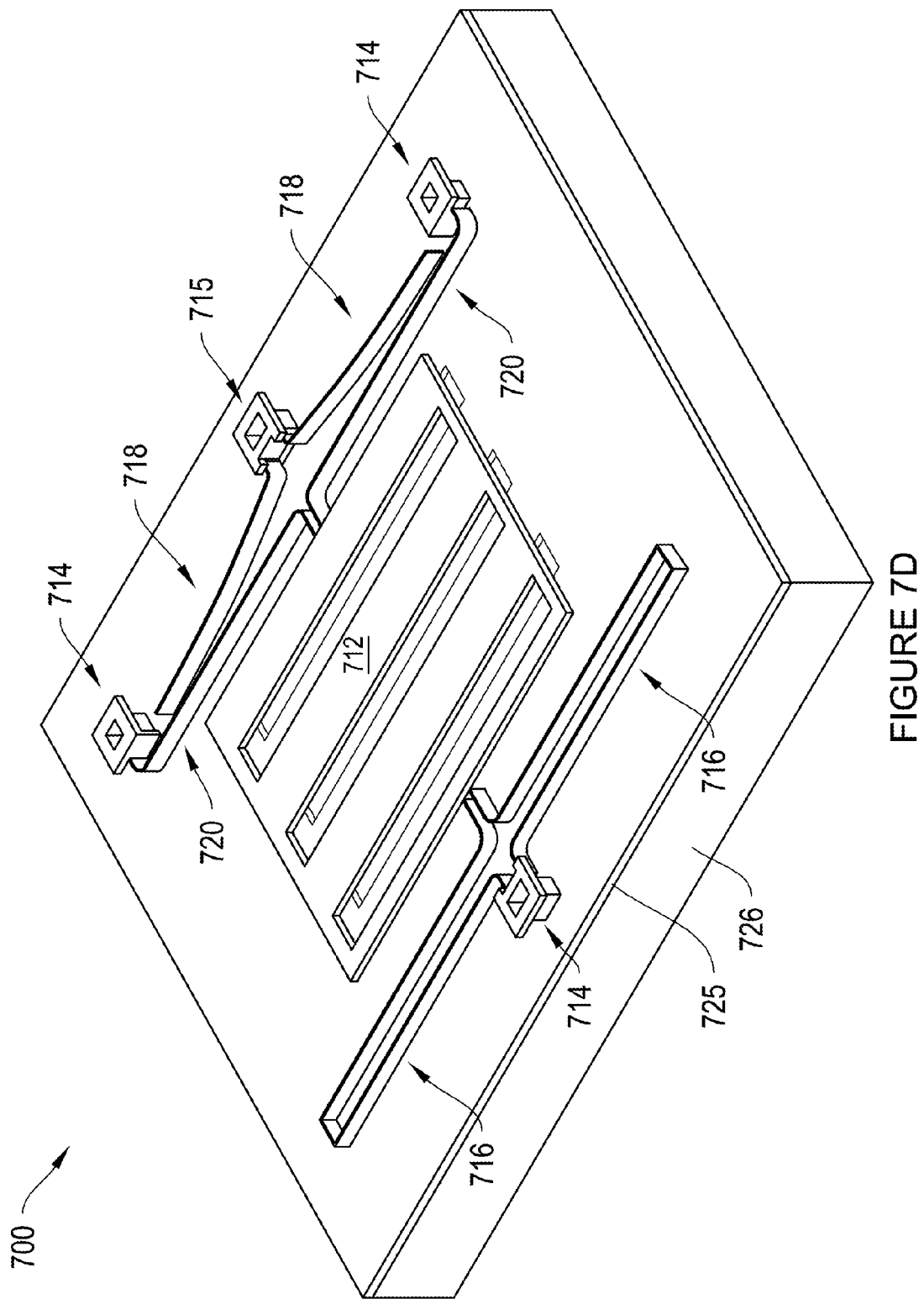

The process of forming the sidewall beams 716, 718 and 720 is completed with the removal of the remainder of the second sacrificial material 705 and the first sacrificial material 701. The result is shown in FIG. 7D. The process of removing sacrificial material is similar to that described with respect to FIG. 6E. The material deposited on the vertical sidewalls 709 of the mold 703 remain as the sidewall beams 716, 718 and 720. The sidewall beam 716 serves as a spring mechanically connecting the anchors 714 to the shutter 712, and also provides a passive restoring force and to counter the forces applied by the actuator formed from the compliant beams 718 and 720. The anchors 714 connect to an aperture layer 725. The sidewall beams 716, 718 and 720 are tall and narrow. The width of the sidewall beams 716, 718 and 720, as formed from the surface of the mold 703, is similar to the thickness of the shutter material as deposited. In some implementations, the width of sidewall beam 716 will be the same as the thickness of shutter 712. In some other implementations, the beam width will be about ½ the thickness of the shutter 712. The height of the sidewall beams 716, 718 and 720 is determined by the thickness of the second sacrificial material 705, or in other words, by the depth of the mold 703, as created during the patterning operation described in relation to FIG. 7B. As long as the thickness of the deposited shutter material is chosen to be less than about 2 microns, the process depicted in FIGS. 7A-7D is well suited for the production of narrow beams. In fact, for many applications the thickness range of 0.1 to 2.0 micron is quite suitable. Conventional photolithography would limit the patterned features shown in FIGS. 7A, 7B and 7C to much larger dimensions, for instance allowing minimum resolved features no smaller than 2 microns or 5 microns.

FIG. 7D depicts an isometric view of the shutter assembly 700, formed after the release operation in the above-described process, yielding compliant beams with cross sections of high aspect ratios. As long as the thickness of the second sacrificial material 705 is, for example, greater than about 4 times larger than the thickness of the shutter material, the resulting ratio of beam height to beam width will be produced to a similar ratio, i.e., greater than about 4:1.

An optional stage, not illustrated above but included as part of the process leading to FIG. 7C, involves isotropic etching of the sidewall beam material to separate or decouple the compliant load beams 720 from the compliant drive beams 718. For instance, the shutter material at point 724 has been removed from the sidewall through use of an isotropic etch. An isotropic etch is one whose etch rate is substantially the same in all directions, so that sidewall material in regions such as point 724 is no longer protected. The isotropic etch can be accomplished in the typical plasma etch equipment as long as a bias voltage is not applied to the substrate 726. An isotropic etch also can be achieved using wet chemical or vapor phase etching techniques. Prior to this optional fourth masking and etch stage, the sidewall beam material exists essentially continuously around the perimeter of the recessed features in the mold 703. The fourth mask and etch stage is used to separate and divide the sidewall material, forming the distinct beams 718 and 720. The separation of the beams 718 and 720 at point 724 is achieved through a fourth process of photoresist dispense, and exposure through a mask. The photoresist pattern in this case is designed to protect the sidewall beam material against isotropic etching at all points except at the separation point 724.

As a final stage in the sidewall process, an encapsulating dielectric is deposited around the outside surfaces of the sidewall beams 716, 718 and 720.

In order to protect the shutter material deposited on the vertical sidewalls 709 of the mold 703 and to produce the sidewall beams 716, 718 and 720 of substantially uniform cross section, some particular process guidelines can be followed. For instance, in FIG. 7B, the sidewalls 709 can be made as vertical as possible. Slopes at the vertical sidewalls 709 and/or exposed surfaces become susceptible to the anisotropic etch. In some implementations, the vertical sidewalls 709 can be produced by the patterning operation at FIG. 7B, such as the patterning of the second sacrificial material 705 in an anisotropic fashion. The use of an additional photoresist coating or a hard mask in conjunction with patterning of the second sacrificial layer 705 allows the use of aggressive plasmas and/or high substrate bias in the anisotropic etch of the second sacrificial material 705 while mitigating against excessive wear of the photoresist. The vertical sidewalls 709 also can be produced in photoimageable sacrificial materials as long as care is taken to control the depth of focus during the UV exposure and excessive shrinkage is avoided during final cure of the resist.

Another process guideline that helps during sidewall beam processing relates to the conformality of the shutter material deposition. The surfaces of the mold 703 can be covered with similar thicknesses of the shutter material, regardless of the orientation of those surfaces, either vertical or horizontal. Such conformality can be achieved when depositing with CVD. In particular, the following conformal techniques can be employed: PECVD, low pressure chemical vapor deposition (LPCVD), and atomic or self-limited layer deposition (ALD). In the above CVD techniques the growth rate of the thin film can be limited by reaction rates on a surface as opposed to exposing the surface to a directional flux of source atoms. In some implementations, the thickness of material grown on vertical surfaces is at least 50% of the thickness of material grown on horizontal surfaces. Alternatively, shutter materials can be conformally deposited from solution by electroless plating or electroplating, after a metal seed layer is provided that coats the surfaces before plating.

The process leading to the shutter assembly 700 in FIG. 7D was a four-mask process, meaning the process incorporated four distinct photolithography stages in which a photosensitive polymer is exposed by illuminating a desired pattern through a photomask. The photolithography stages, also known as masking steps, are amongst the most expensive in the manufacture of MEMS devices, and so it is desirable to create a manufacturing process with a reduced number of masking stages.

Figure 8:
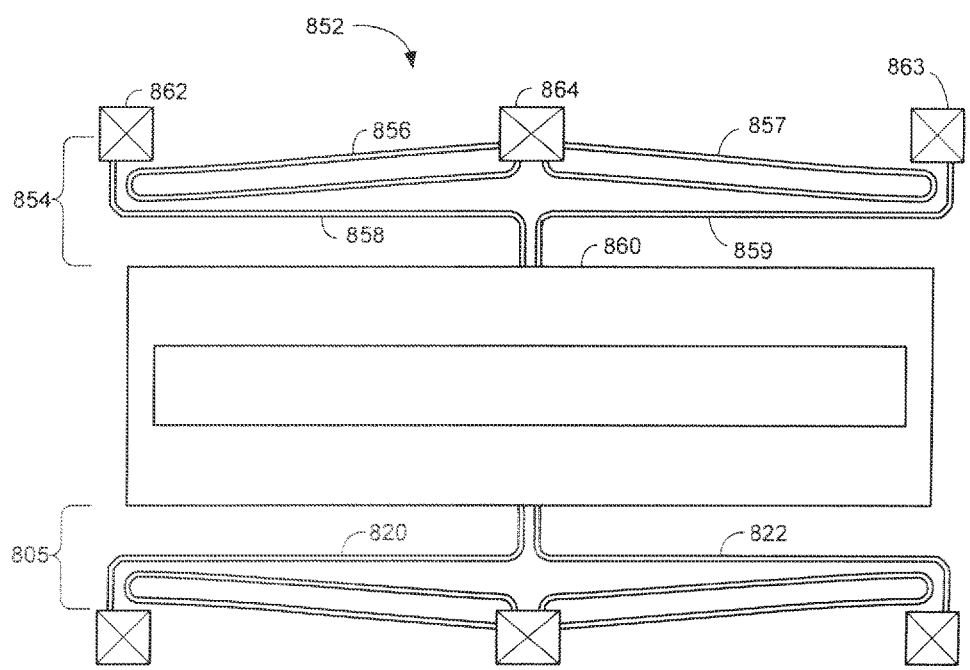
FIG. 8 shows a plan view of an example shutter assembly incorporating a looped drive beam.

FIG. 8 shows a plan view of an example shutter assembly 852 incorporating a looped drive beam. The looped drive beam forms part of a dual compliant actuator assembly 854. The dual compliant actuator assembly 854 functions similarly to the actuator 404 designed for the shutter assembly 400 of FIGS. 4A and 4B. The actuator assembly 854 includes compliant drive beams 856 and 857, along with compliant load beams 858 and 859. The load beams 858 and 859 support a shutter 860 on one end and are respectively attached to load beam anchors 862 and 863 at the other end. The drive beams 856 and 857 are shaped as a loop. Each end of the drive beams 856 and 857 is attached to a common anchor 864. Along the loop, there is a section of outgoing beam which is substantially parallel to a returning section of the same beam. The lengths of these two loop sections are substantially equal. When formed in a sidewall beam process, the stresses which would tend to deform the outgoing section of the drive beams 856 and 857 will mirror or oppose the stresses along the returning section of the beams 856 and 857.

The compliant beams that make up the drive beams 856 and 857 can be completely defined using only the first three mask stages described with respect to shutter assembly 700 depicted in FIGS. 7A-7D. The fourth photo-lithography stage, in which the drive beam is separated from the load beam is not used to manufacture the beams 856 and 857. The loops completely enclose or form the periphery around the boundary of a space. Since there is no termination in the loops (as is expected for the boundary around an enclosed space) the fourth photo-lithography stage is not required.

In order to eliminate the fourth mask completely, a method is sought whereby other compliant beams in the structure are also made to incorporate shapes analogous to loops. A termination of a sidewall beam is not necessary as long as the beam forms a boundary which completely encloses a space. The load beam 858 in the shutter assembly 852 is terminated at the load beam anchor 862, and so in this implementation, a fourth masking stage is used to terminate the beam 858 at the anchor 862.

Figure 9:
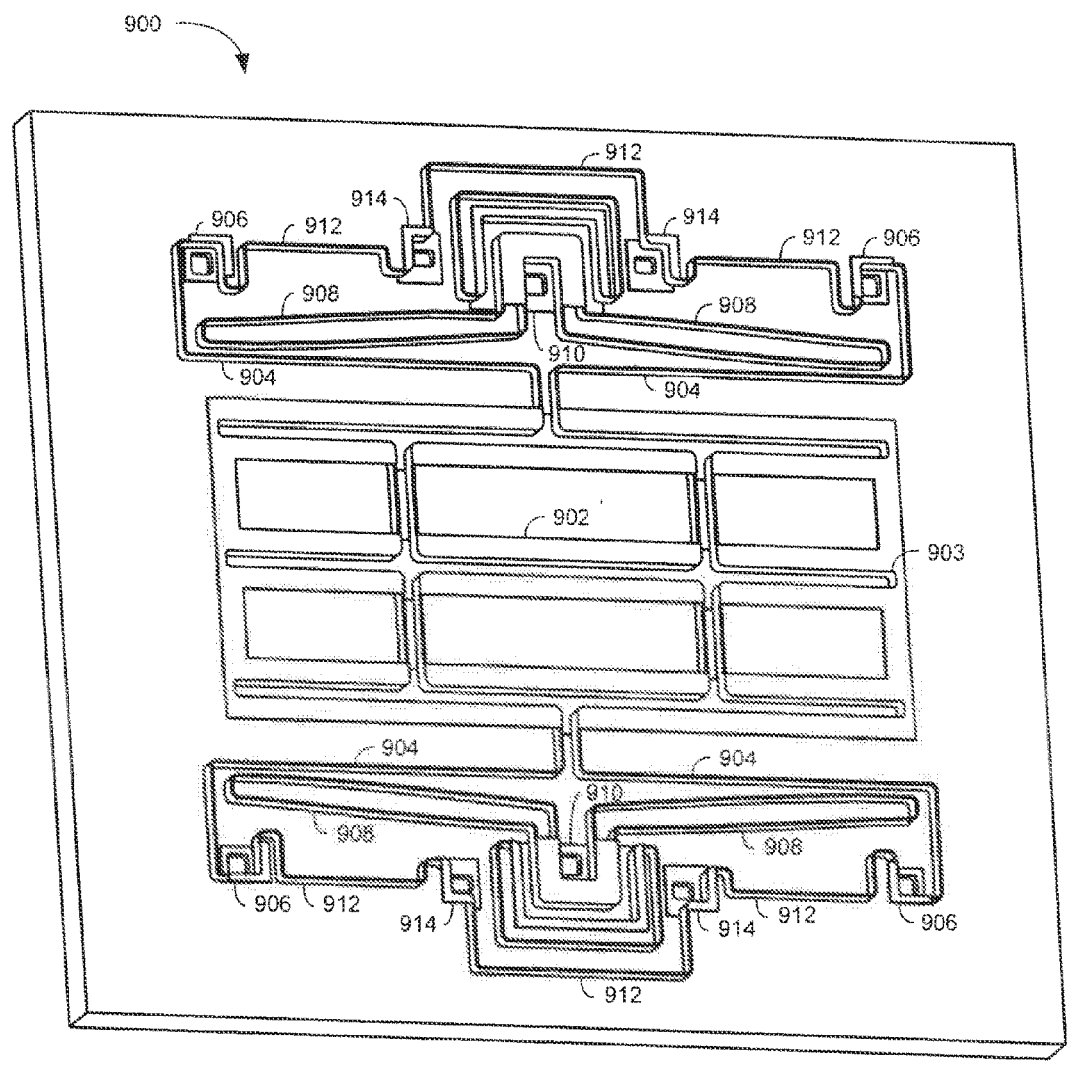
FIG. 9 shows an isometric view of an example shutter assembly built according to a 3-mask process.

FIG. 9 shows an isometric view of an example shutter assembly 900 built according to a three-mask process. That is, the shutter assembly 900 can be manufactured using only three masking stages. Those three masking stages are referred to as an anchor definition stage, a mold definition stage, and a shutter definition stage, used to develop patterns into a first sacrificial layer, a second sacrificial layer, and a shutter material, respectively. As described with respect to the shutter assembly 700, the compliant beams are formed at the sidewalls of the mold, also referred to as the second sacrificial layer. The shutter assembly 900 can be fabricated using a three-mask process because the beams are designed as closed boundaries that enclose the periphery of features in the mold.

The shutter assembly 900 includes a shutter 902, stiffening ribs 903, load beams 904, load beam anchors 906, drive beams 908, and drive beam anchors 910. The drive beams 908 are formed into a loop, which is attached to the substrate at anchor 910. The drive beams 908 enclose the space within the loop. The shutter assembly 900 additionally includes peripheral beams 912 as well as peripheral anchors 914. The load beams 904 and the drive beams 908 together form a set of compliant actuator beams. When a voltage is imposed between these two beams, the shutter 902 is caused to move between open and closed positions.

The load beams 904 extend from the shutter 902 to the load beam anchors 906. The peripheral beams 912 extend from the load beam anchors 906 to the peripheral anchors 914. The peripheral beams 912 also connect together the peripheral anchors 914. In some implementations, the peripheral beams 912 do not play an active mechanical function or an optical function within the shutter assembly 900. The peripheral beams 912 serve to extend the geometry of the load beams 904 so that these compliant beams can become connected. Together, the load beams 904 and peripheral beams 912 form a boundary which completely encloses a space.

Figure 10:
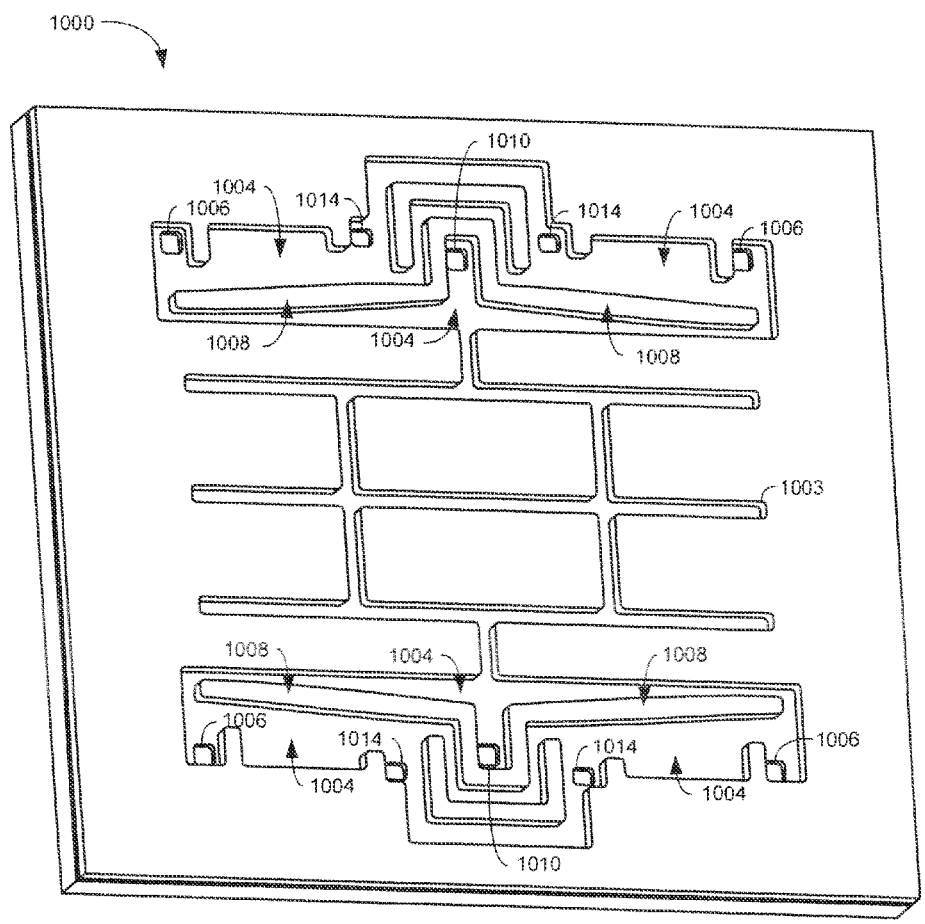
FIG. 10 shows an example mold suitable for manufacture of the shutter assembly of FIG. 9.

FIG. 10 shows an example mold 1000 suitable for manufacture of the shutter assembly 900 of FIG. 9. The mold 1000 is formed from a set of sacrificial materials, and is patterned as part of the 2D photo-lithography stage in the fabrication of the shutter assembly 900. FIG. 10 shows the mold 1000 before the shutter material has been deposited. The outlines of the shutter 902 are therefore not present in FIG. 10. The mold 1000 does, however, include indentations 1003 that will be used to shape stiffening ribs shown in the shutter assembly 900.

The mold 1000 generally includes three kinds of surfaces. The mold 1000 includes sidewalls, upon which the compliant beams will be formed, as well as upper and lower surfaces. The lower surfaces of the mold are the horizontal surfaces formed by the interface between first and second sacrificial materials that form the mold 1000. The upper surfaces of the mold are horizontal surfaces in a plane most distant from an underlying substrate.

The mold 1000 generally defines two kinds of shapes, both of which are enclosed or bounded by sidewalls upon which the compliant beams can be formed. A mesa, as used herein, is a space defined by a presence of mold material enclosed by mold sidewalls. A recess, as used herein, is defined by a space of mold material absence, enclosed by mold sidewalls.

The mold 1000 includes mesa shapes 1008. The sidewalls which enclose the mesas 1008 are used to form the drive beams 908. The drive beams 908 will thereby have the shape of loops without termination.

The mold 1000 also includes a recess 1004. The sidewalls which enclose this recess 1004 are used to form the load beams 904.

The mold 1000 also includes load beam anchor holes 1006. The load beam anchor holes 1006 were formed in a previous stage as part of the first sacrificial layer. The mold 1000 also includes drive beam anchor holes 1010.

Both the load beams 904 and the drive beams 908 in the shutter assembly 900 are therefore formed as boundaries that completely enclose a space. The spaces are formed from one of either a mesa shape or a recess shape in the mold 1000. The boundaries of the shapes that form the load beams 904 and the drive beams 908 do not intersect. The loop for the drive beam 908 is completely enclosed within the loop that forms the load beam 904.

In some implementations, a gap can be provided between or along one or more ribs formed in a shutter to mitigate against global deformations of the shutter. The gap provides a region of greater flexibility to mitigate against the transfer of stresses to a remainder of the shutter, thereby confining the impact of those stresses as localized deformations at or around the gap. In such fashion, the shutter can be stiffened by one or more ribs, while stress relief can be provided by one or more gaps between or along the ribs.

Figure 11A:
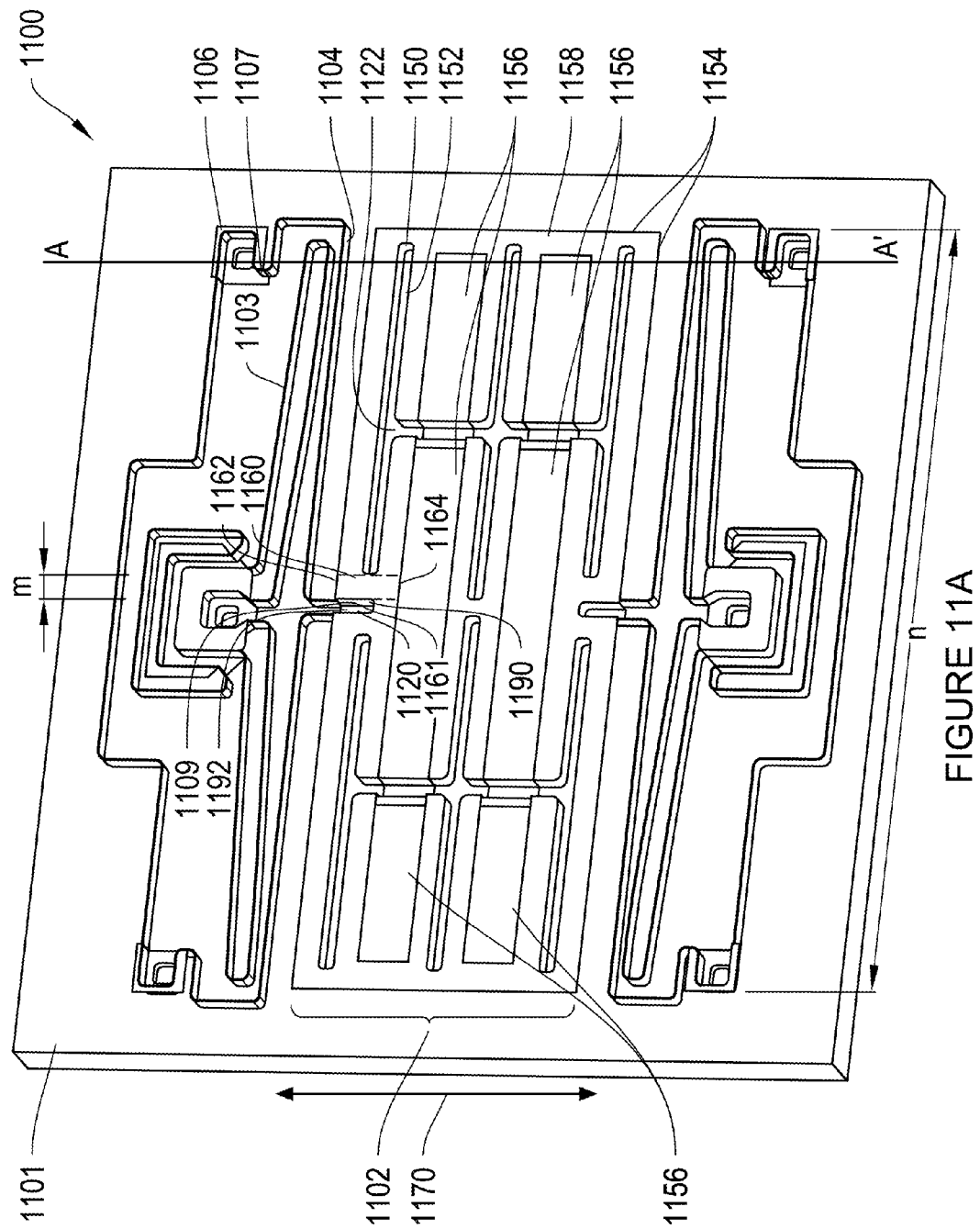
FIG. 11A shows an isometric view of an example shutter assembly.
Figure 11B:
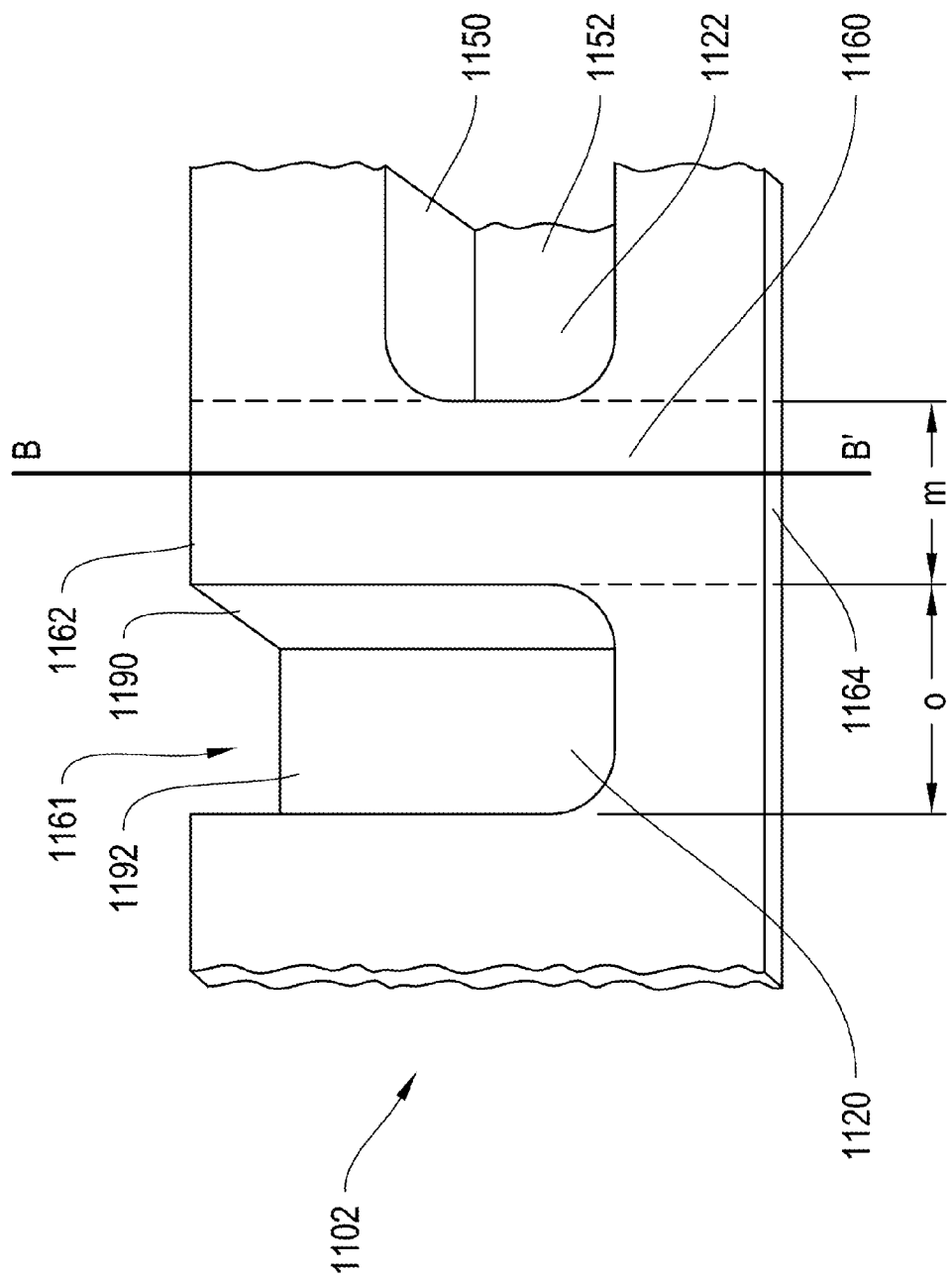
FIG. 11B shows an enlarged view of a portion of the shutter assembly of FIG. 11A.

FIG. 11A shows an isometric view of an example shutter assembly 1100, and FIG. 11B shows an enlarged view of a portion of the shutter assembly 1100 of FIG. 11A. In some implementations, the shutter assembly 1100 can be used as a light modulator for a display. By way of preview, the shutter assembly 1100 includes a shutter 1102 having stress relief features to allow localized deformations of the shutter 1102, instead of global deformations. Although theses features are described for a MEMS shutter assembly (e.g., for a MEMS light modulator), such features can be utilized in other MEMS assemblies. For example, in some implementations, such features are incorporated into other MEMS assemblies that include a suspended planar body supported over a substrate, such as a proof mass in a MEMS tuning fork accelerometer or gyroscope, in addition to other MEMS devices.

The shutter assembly 1100 includes a substrate 1101 having a primary horizontal surface, upon which the shutter assembly 1100 is disposed. The shutter assembly 1100 also includes anchors 1106 disposed on the substrate 1101 and load beams 1104. The load beams 1104 each have a first end 1107 connected to one of the anchors 1106. As shown in FIG. 11A, each load beam 1104 extends from and is connected to a shutter-facing side of a corresponding anchor 1106, namely the side of the anchor 1106 facing towards the shutter 1102. Such connectivity can be referred to as a "South" anchor implementation, which imparts greater stress insensitivity and facilitates manufacturability of the shutter assembly 1100. A second end 1109 of each load beam 1104 is connected to the shutter 1102 at a beam attachment location 1161, supporting the shutter 1102 over the substrate 1101. The shutter 1102 includes light transmitting portions 1156 and light blocking portions 1158. The light transmitting portions 1156 are formed as shutter apertures in the light blocking portions 1158. In some implementations, the light transmitting portions 1156 can be filled, partially or completely, by a transparent material, such as a dielectric material. The light blocking portions 1158 can be formed so as to include at least one opaque material, as previously described.

The shutter 1102 includes stiffening ribs or depressions 1120 and 1122, which restrict the bending of the shutter 1102 in regions of the shutter 1102 over which they extend. The stiffening ribs 1120 and 1122 are formed with substantially non-horizontal portions 1150 and 1190 corresponding to sidewalls of the ribs 1120 and 1122, and substantially horizontal portions 1152 and 1192 that are adjacent to the substantially non-horizontal portions 1150 and 1190 and corresponding to the bottoms of the ribs 1120 and 1122. As depicted in FIG. 11A, the stiffening ribs 1120 and 1122 extend out of a plane of the shutter 1102 and open away from the substrate 1101 upon which the shutter 1102 is supported. Stated in another way, the substantially horizontal portions 1152 and 1192 of the ribs 1120 and 1122 are vertically displaced from an upper surface of the shutter 1102, and the ribs 1120 and 1122 protrude towards the underlying substrate 1101. The protrusion of the ribs 1120 and 1122 towards the underlying substrate 1101 facilitates manufacturability of the shutter 1102 and provides improved optical performance of the shutter 1102, such as in terms of blocking light when the shutter 1102 is in a closed state.

As shown in FIG. 11A and FIG. 11B, the shutter 1102 includes at least one substantially horizontal portion 1160 disposed along the upper surface of the shutter 1102. The substantially horizontal portion 1160 is disposed between the substantially non-horizontal portions 1150 and 1190 of the stiffening ribs 1120 and 1122. Likewise, the substantially horizontal portion 1160 is disposed between the substantially horizontal portions 1152 and 1192 of the stiffening ribs 1120 and 1122. The substantially horizontal portion 1160 corresponds to a gap or break in the stiffening ribs 1120 and 1122, separating the ribs 1120 and 1122 by an extent or distance (m). The inclusion of the substantially horizontal portion 1160 provides a bending region for the shutter 1102 that facilitates localized deformation of the shutter 1102 and provides for the relief of stresses imposed on the shutter 1102 during manufacturing or actuation of the shutter 1102. In some implementations, the shutter 1102 has a length (n) (i.e., the dimension along its longest side) that is substantially perpendicular to a direction of motion 1170 of the shutter 1102, and the extent of the gap between the ribs 1120 and 1122 can be up to about 50% of the length of the shutter 1102, such as up to about 40%, up to about 30%, up to about 20%, up to about 15%, up to about 10%, or up to about 5%, and down to about 2%, down to about 1%, down to about 0.5%, or less. In some implementations, the length of the shutter 1102 is in the range of about 50 μm to about 300 μm, such as from about 100 μm to about 250 μm or from about 100 μm to about 200 μm, and the extent of the gap between the ribs 1120 and 1122 can be up to about 60 μm, such as up to about 45 μm, up to about 30 μm, or up to about 15 μm, and down to about 5 μm, down to about 2 μm, down to about 1 μm, or less. In some implementations, the ribs 1120 and 1122 have a width (o), and the extent of the gap between the ribs 1120 and 1122 can be up to about 5 times the width of the ribs 1120 and 1122, such as up to about 4 times, up to about 3 times, up to about 2 times, or up to about 1.5 times. In such implementations, the extent of the gap can be substantially the same as, or somewhat greater than, the width of the ribs 1120 and 1122, or can be smaller than the width of the ribs 1120 and 1122, such as up to about ¾ times the width of the ribs 1120 and 1122, up to about ½ times the width of the ribs 1120 and 1122, up to about 4/10 times the width of the ribs 1120 and 1122, up to about 3/10 times the width of the ribs 1120 and 1122, up to about 2/10 times the width of the ribs 1120 and 1122, or up to about 1/10 times the width of the ribs 1120 and 1122, and down to a smallest patternable dimension of a manufacturing process.

Referring to FIG. 11A and FIG. 11B, the substantially horizontal portion 1160 extends from a first edge 1162 to a directly opposing second edge 1164 of the shutter 1102, and is disposed between the beam attachment location 1161 and the substantially non-horizontal portion 1150 of the rib 1122. As used herein, "directly opposing" edges can refer to edges that can be connected by a set of straight lines, such that the substantially horizontal portion 1160 is bounded by the two directly opposing edges 1162 and 1164 and by two straight lines that intersect the edges 1162 and 1164 (which may, but need not necessarily, intersect the edges 1162 and 1164 at right angles), as shown by dotted lines in the shutter assembly 1100 of FIG. 11A. The first edge 1162 forms at least a portion of an outer periphery 1154 of the shutter 1102, and the second edge 1164 forms at least a portion of a perimeter of an aperture 1156 in the light blocking portion 1158. More particularly, the first edge 1162 forms at least a portion of a lengthwise edge of the shutter 1102 (i.e., the edge of the shutter 1102 extending along its length), and the second edge 1164 forms at least a portion of a lengthwise edge of the shutter aperture 1156 (i.e., the edge of the shutter aperture 1156 extending along its length). As shown in FIG. 11A and FIG. 11B, the first edge 1162 and the second edge 1164 are substantially straight and substantially parallel to one another. In some other implementations, the first edge 1162 and the second edge 1164 need not be straight or parallel.

Figure 11C:
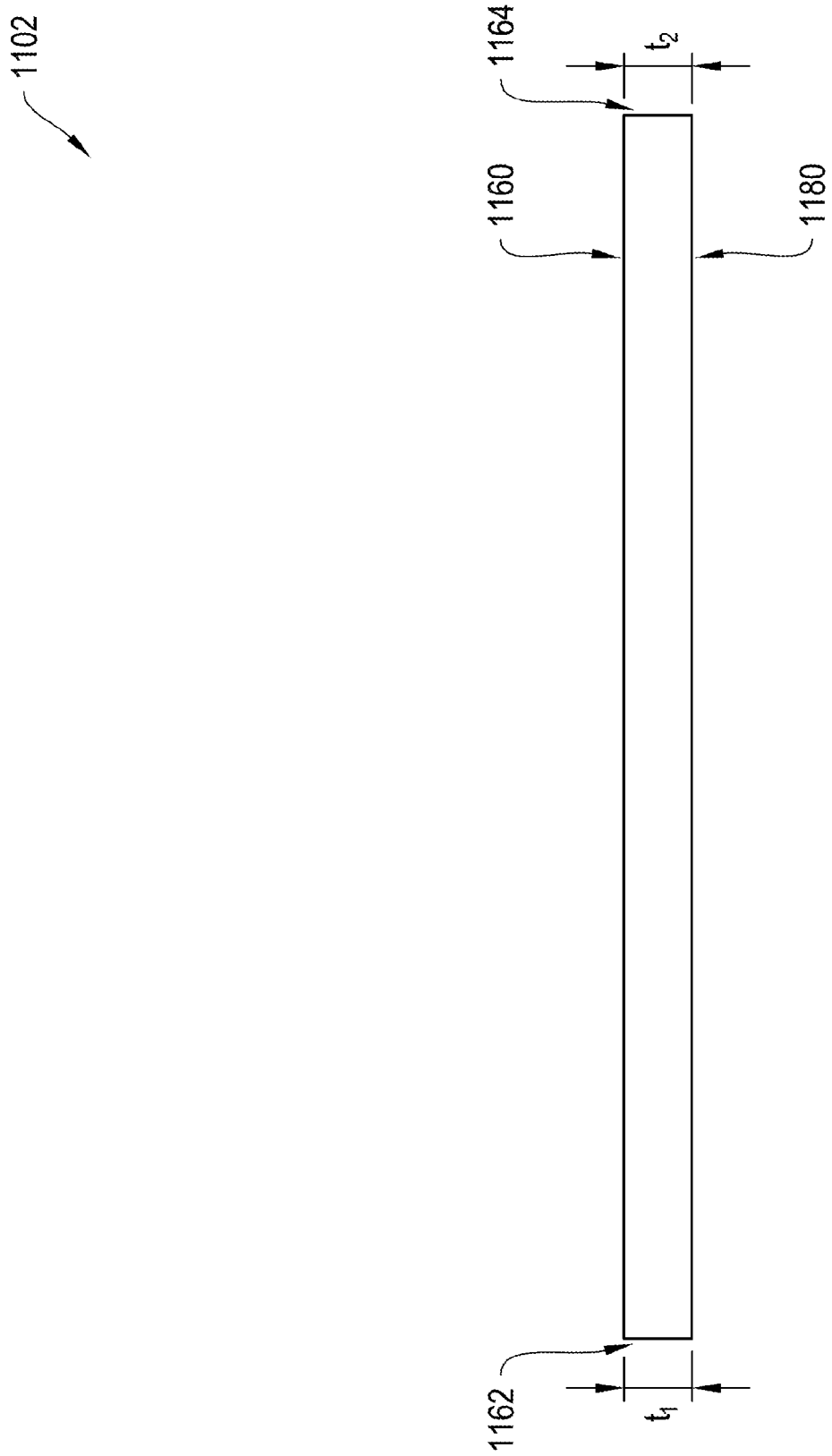
FIG. 11C shows a cross sectional view of the portion of the shutter assembly of FIG. 11B.

FIG. 11C shows a cross sectional view of the portion of the shutter assembly 1100 shown in FIG. 11B. The cross section is taken at line B-B' of FIG. 11B. Referring to FIG. 11A, FIG. 11B, and FIG. 11C, the gap between the stiffening ribs 1120 and 1122 is defined by the substantially horizontal portion 1160 and another substantially horizontal portion 1180, which is disposed along a lower surface of the shutter 1102. The substantially horizontal portion 1160 faces away from the underlying substrate 1101, while the substantially horizontal portion 1180 faces towards the underlying substrate 1101. Like the substantially horizontal portion 1160, the substantially horizontal portion 1180 extends from the first edge 1162 to the second edge 1164 of the shutter 1102. The pair of substantially horizontal portions 1160 and 1180 defines a bending region that is substantially devoid of protrusions or other vertical displacements to provide greater local flexibility. In such fashion, stresses imposed on the shutter 1102 through the beam attachment location 1161 can be confined through localized bending of this region of greater flexibility. As shown in FIG. 11C, a thickness of the shutter 1102 in this bending region is substantially uniform from the first edge 1162 to the second edge 1164. Stated in another way, a thickness $t_1$ of the shutter 1102 at the first edge 1162 is substantially the same as a thickness $t_2$ of the shutter 1102 at the second edge 1162.

Referring to FIG. 11A and FIG. 11B, the first edge 1162 and the second edge 1164 both are substantially perpendicular to the direction of motion 1170 of the shutter 1102. The motion of the shutter 1102 is accomplished when the load beam 1104 experiences an electrostatic force (e.g., due to voltage applied to a drive beam 1103) that moves the load beam 1104 and thereby results in the motion of the attached shutter 1102. The motion of the shutter 1102 is substantially in-plane with the substrate 1101.

As shown in FIG. 11A, the stiffening rib 1122 is formed as a single continuous structure that extends across a substantial portion of the shutter 1102, and left and right portions of the rib 1122 (which are separated by the substantially horizontal portion 1160) are connected elsewhere at one or more locations along the shutter 1102. At least one of the ribs 1120 and 1122 extends to a location on the shutter 1102 that is adjacent or close to at least a portion of the outer periphery 1154 of the shutter 1102. By extending close to one or more locations on the outer periphery 1154 of the shutter 1102, the ribs 1120 and 1122 can provide greater structural integrity in the regions of the shutter 1102 over which they extend. Collectively, in some implementations, the ribs 1120 and 1122 can account for a substantial portion of an overall area of the light blocking portions 1158 of the shutter 1102 (i.e., an area of the shutter 1102 excluding the shutter apertures 1156). In some implementations, the ribs 1120 and 1122 can account for at least about 50% of the area of the light blocking portions 1158 of the shutter 1102. In some other implementations, the ribs 1120 and 1122 can account for at least about 60%, at least about 70%, at least about 80% or more of the area of the light blocking portions 1158 of the shutter 1102. In such fashion, a substantial portion of the shutter 1102 can be stiffened by the ribs 1120 and 1122, while stress relief can be provided by one or more substantially horizontal portions (e.g., the portion 1160) corresponding to gaps between or along the ribs 1120 and 1122. Although the stiffening rib 1122 is depicted as a single continuous structure, the rib 1122 can be segmented into multiple, distinct ribs in other implementations. Such distinct ribs can be separated by substantially horizontal portions of the shutter 1102 that are similarly configured as the portion 1160.

Although the foregoing passages have referenced the substantially horizontal portion 1160, it should be appreciated that the shutter 1102 can include more than one such portion to provide stress relief. Specifically, the shutter 1102 depicted in FIG. 11A includes four such substantially horizontal portions located adjacent to two beam attachment locations 1161 at opposing lengthwise edges of the shutter 1102.

In some implementations, the shutter assembly 1100 is manufactured using a mold that is patterned with indentations and at least one substantially horizontal portion. Deposition of a shutter material over the patterned mold followed by a further patterning stage yields the shutter 1102 including the stiffening ribs 1120 and 1122 and the substantially horizontal portion 1160.

Figure 12:
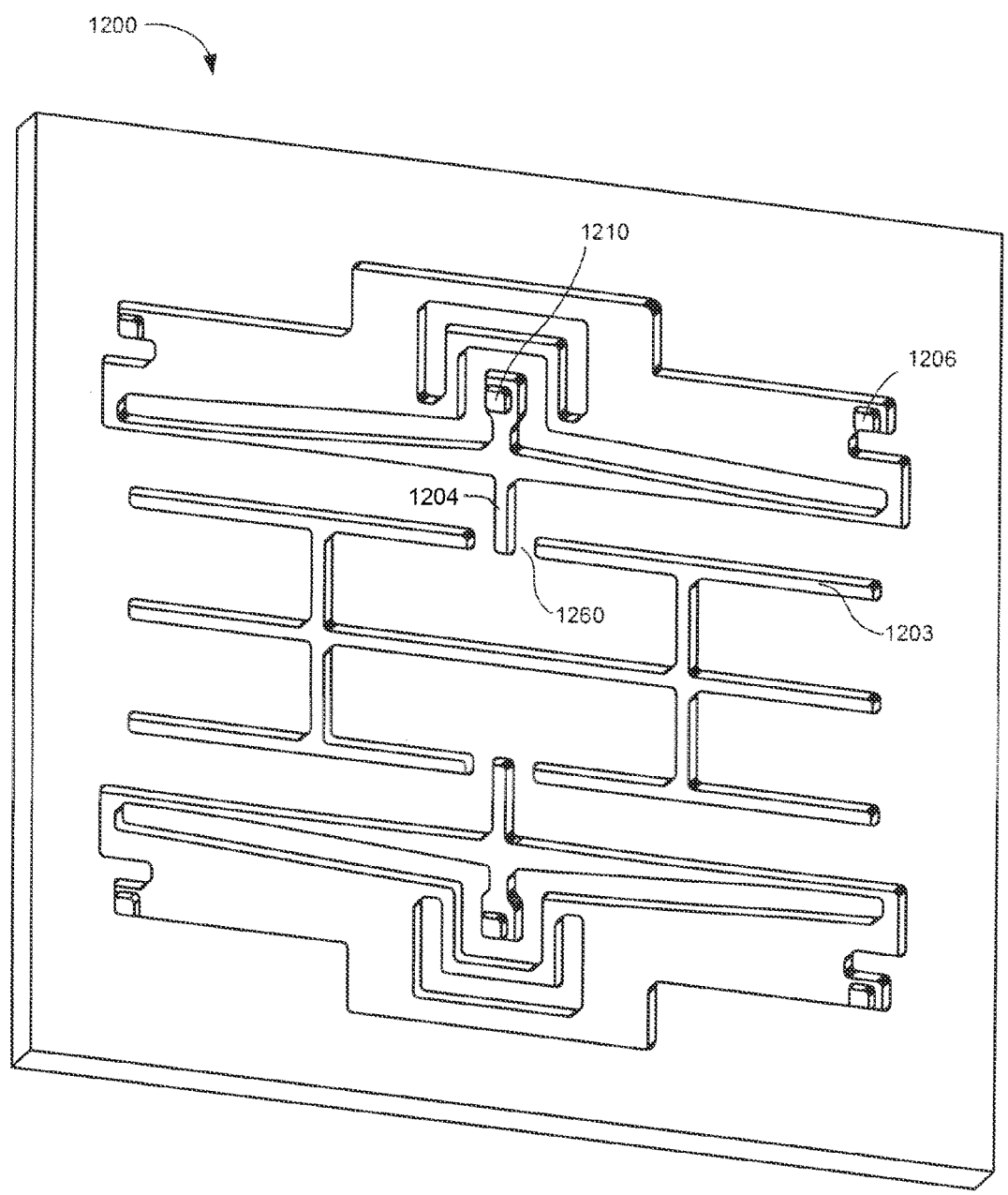
FIG. 12 shows an example mold suitable for manufacture of the shutter assembly of FIG. 11A and FIG. 11B.

FIG. 12 shows an example mold 1200 suitable for manufacture of the shutter assembly 1100 of FIG. 11A, FIG. 11B and FIG. 11C. The mold 1200 is formed from a set of sacrificial materials, such as was previously described in relation to FIGS. 7A-7D, and is patterned as part of the photo-lithography stage in the fabrication of the shutter assembly 1100. FIG. 12 shows the mold 1200 before a shutter material has been deposited. The outlines of the shutter 1102 are therefore not present in FIG. 12. The mold 1200 does, however, include indentations 1203 and 1204 that will be used to shape the stiffening ribs 1120 and 1122 shown in the shutter assembly 1100. Certain aspects of the mold 1200 are similarly implemented as previously described with reference to the molds 703 and 1000 of FIGS. 7A-7D and FIG. 10.

The mold 1200 generally includes five kinds of surfaces. The mold 1200 includes sidewalls, upon which compliant beams and non-horizontal surfaces of the ribs 1120 and 1122 will be formed, as well as upper and intermediate horizontal surfaces. The intermediate surfaces of the mold 1200 are the horizontal surfaces formed by the interface between first and second sacrificial materials that form the mold 1200. The upper surfaces of the mold 1200 are horizontal surfaces in a plane most distant from an underlying substrate. The upper surfaces of the mold 1200 include a substantially horizontal portion 1260 that results in the formation of the substantially horizontal portion 1160 of the shutter assembly 1100 after deposition of the shutter material.

The mold 1200 also includes load beam anchor holes 1206, which are defined by sidewalls and lower horizontal surfaces. The load beam anchor holes 1206 were formed in a previous stage of the fabrication process as part of the first sacrificial layer. The mold 1200 also includes drive beam anchor holes 1210.

Although FIG. 12 illustrates the mold 1200 for use with a three-mask process for forming the shutter assembly 1100, a four-mask process or any other suitable process can be employed to form the shutter assembly 1100.

Figure 13:
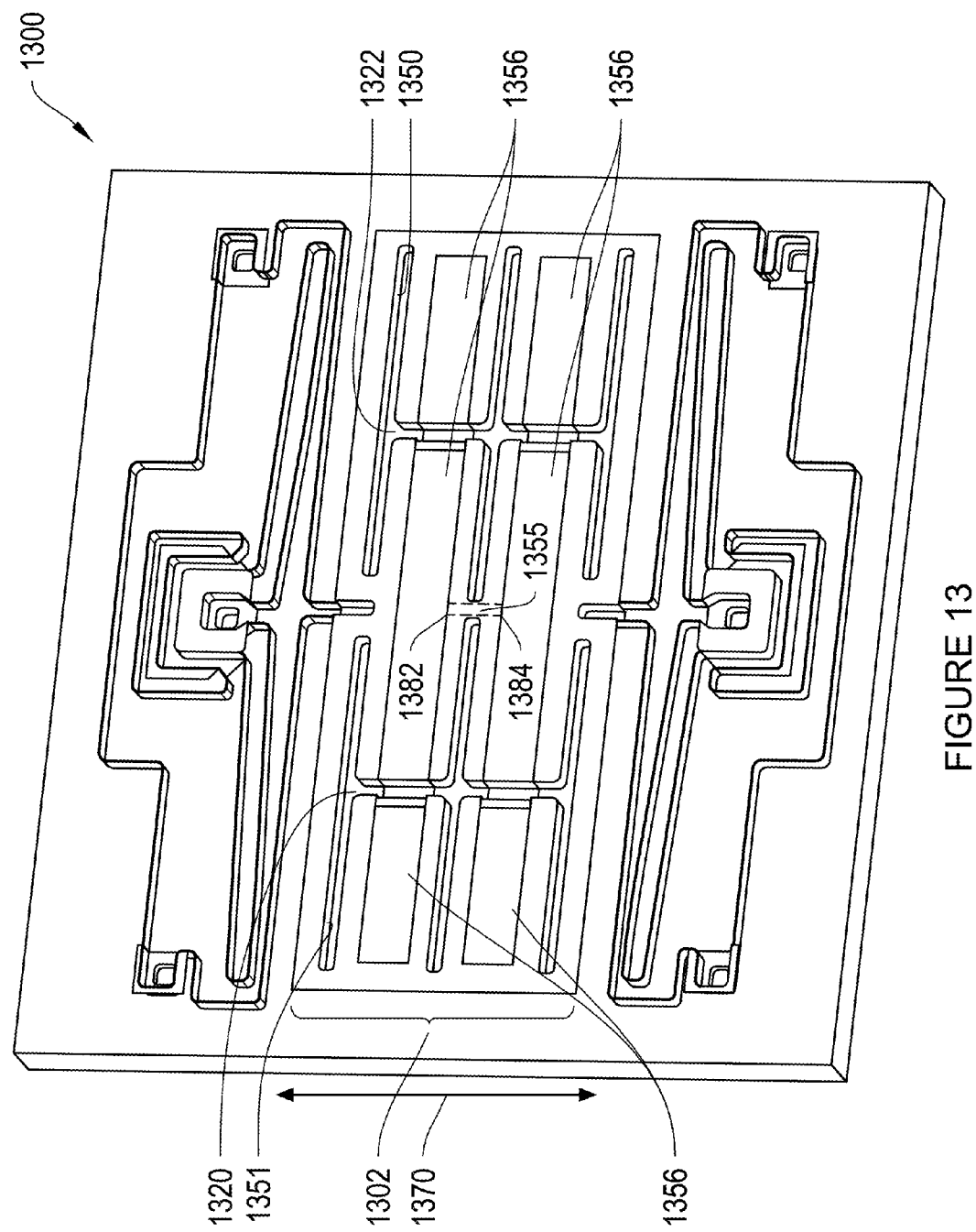
FIG. 13 shows an isometric view of another example shutter assembly.

FIG. 13 shows an isometric view of another example shutter assembly 1300. In some implementations, the shutter assembly 1300 can be used as a light modulator for a display, as previously described. The shutter assembly 1300 includes a shutter 1302.

The shutter assembly 1300 is similar to the shutter assembly 1100 described in relation to FIG. 11A, FIG. 11B and FIG. 11C except that, instead of including a single contiguous rib or depression extending across a substantial portion of the shutter 1102 as shown in FIG. 11A, the shutter 1302 is formed with two distinct ribs 1320 and 1322 that are separated by a gap or break. As depicted in FIG. 13, the shutter 1302 includes two substantially non-horizontal portions 1350 and 1351 that correspond to sidewalls of the two distinct ribs 1320 and 1322. The shutter 1302 also includes a substantially horizontal portion 1355 that separates the first substantially non-horizontal portion 1350 and the second substantially non-horizontal portion 1351 of the two distinct ribs 1320 and 1322. The substantially horizontal portion 1355 provides a bending region for the shutter 1302 that facilitates localized deformation of the shutter 1302 and provides for the relief of stresses. Although the shutter 1302 is depicted with additional gaps or breaks adjacent to its beam attachment locations, such additional gaps or breaks can be omitted in some other implementations. Certain aspects of the substantially horizontal portion 1355 are similarly implemented as previously described with reference to the substantially horizontal portion 1160 of FIG. 11A, FIG. 11B, and FIG. 11C.

In the example shown in FIG. 13, the substantially horizontal portion 1355 extends from a first edge 1382 to a directly opposing second edge 1384 of the shutter 1302, and is located substantially at a geometric center of the shutter 1302. In some implementations, the substantially horizontal portion 1355 can overlap or encompass the geometric center of the shutter 1302. The shutter 1302 includes light transmitting portions 1356, which are formed as shutter apertures. The first edge 1382 forms at least a portion of a perimeter of a first shutter aperture 1356 formed in the shutter 1302. The second edge 1384 forms at least a portion of a perimeter of a different, second shutter aperture 1356 formed in the shutter 1302. More particularly, the first edge 1382 forms at least a portion of a lengthwise edge of the first shutter aperture 1356 (i.e., the edge of the first shutter aperture 1356 extending along its length), and the second edge 1384 forms at least a portion of a lengthwise edge of the second shutter aperture 1356 (i.e., the edge of the second shutter aperture 1356 extending along its length). As depicted in FIG. 13, the first edge 1382 and the second edge 1384 both are substantially perpendicular to a direction of motion 1370 of the shutter 1302. The motion of the shutter 1302 is substantially in-plane with a substrate.

In some implementations, the shutter assembly 1300 is manufactured using a mold that is patterned with indentations and at least one substantially horizontal portion. Deposition of a shutter material over the patterned mold followed by a further patterning stage yields the shutter 1302 including the stiffening ribs 1320 and 1322 and the substantially horizontal portion 1355.

Figure 14:
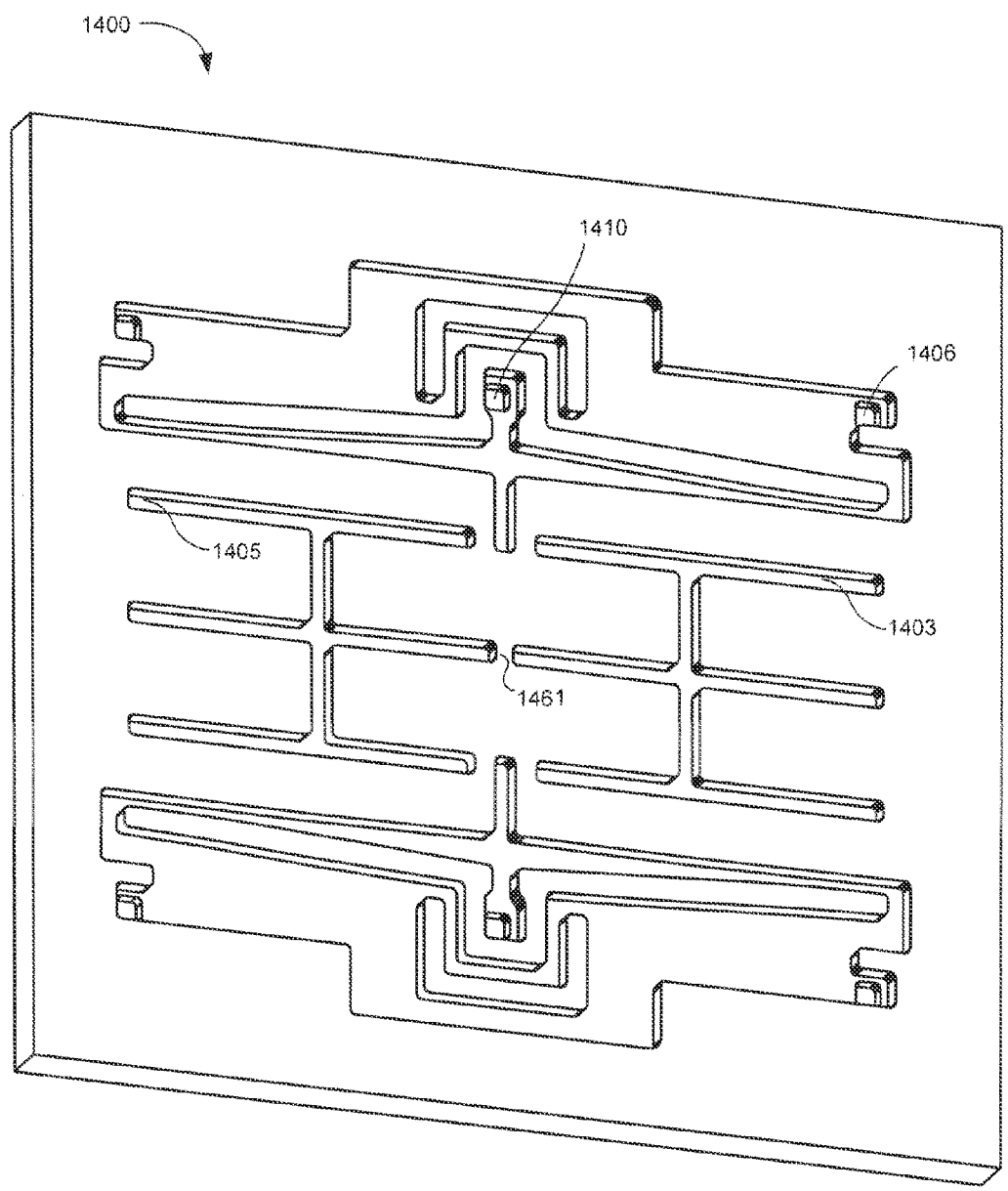
FIG. 14 shows an example mold suitable for manufacture of the shutter assembly of FIG. 13.

FIG. 14 shows an example mold 1400 suitable for manufacture of the shutter assembly 1300 of FIG. 13. The mold 1400 is formed from a set of sacrificial materials, such as was previously described in relation to FIGS. 7A-7D, and is patterned as part of the photo-lithography stage in the fabrication of the shutter assembly 1300. FIG. 14 shows the mold 1400 before a shutter material has been deposited. The outlines of the shutter 1302 are therefore not present in FIG. 14. The mold 1400 does, however, include indentations 1403 and 1405 that will be used to shape the stiffening ribs 1320 and 1322 shown in the shutter assembly 1300.

The mold 1400 generally includes five kinds of surfaces. The mold 1400 includes sidewalls, upon which compliant beams and non-horizontal surfaces of the ribs 1320 and 1322 will be formed, as well as upper and intermediate horizontal surfaces. The intermediate surfaces of the mold 1400 are the horizontal surfaces formed by the interface between first and second sacrificial materials that form the mold 1400. The upper surfaces of the mold 1400 are horizontal surfaces in a plane most distant from an underlying substrate. The upper surfaces of the mold 1400 include a substantially horizontal portion 1461 that results in the formation of the substantially horizontal portion 1355 of shutter assembly 1300 after deposition of the shutter material.

The mold 1400 also includes load beam anchor holes 1406, which are defined by sidewalls and lower horizontal surfaces. The load beam anchor holes 1406 were formed in a previous stage of the fabrication process as part of the first sacrificial layer. The mold 1400 also includes drive beam anchor holes 1410.

Although FIG. 14 illustrates the mold 1400 for use with a three-mask process for forming the shutter assembly 1300, a four-mask process or any other suitable process can be employed to form the shutter assembly 1300.

Figure 15:
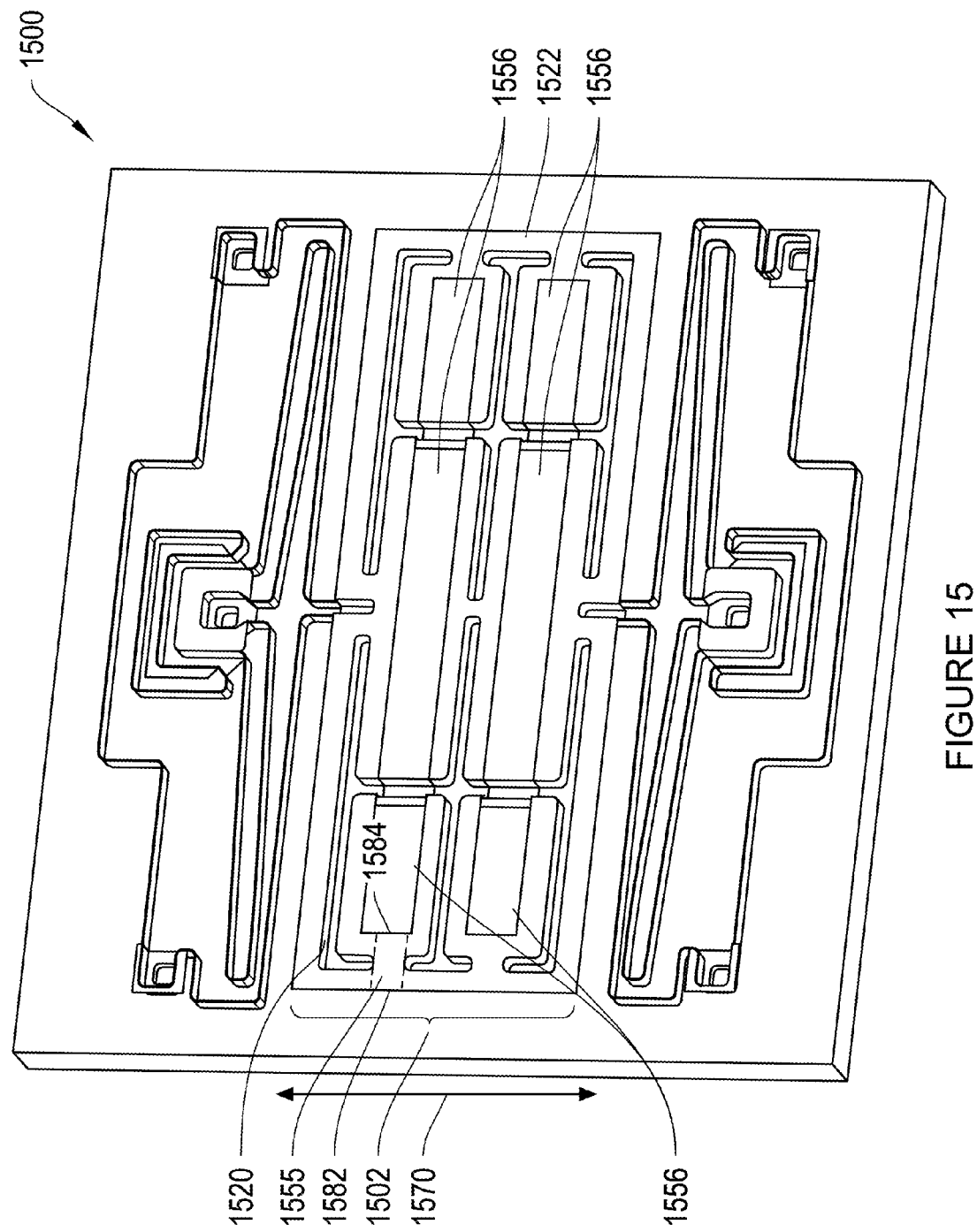
FIG. 15 shows an isometric view of another example shutter assembly.

FIG. 15 shows an isometric view of another example shutter assembly 1500. In some implementations, the shutter assembly 1500 can be used as a light modulator for a display, as previously described. The shutter assembly 1500 includes a shutter 1502.

The shutter assembly 1500 is similar to the shutter assemblies 1100 and 1300 described in relation to FIG. 11A, FIG. 11B, FIG. 11C and FIG. 13 except that the shutter 1502 is formed with ribs 1520 and 1522 that include side portions. One or more gaps or breaks are provided in those side portions of the ribs 1520 and 1522. As depicted in FIG. 15, the ribs 1520 and 1522 include portions extending between side edges of the shutter 1502 and side edges of shutter apertures 1556. Those side portions of the ribs 1520 and 1522 are separated by one or more substantially horizontal portions. For example, the shutter 1502 includes a substantially horizontal portion 1555 that separates a first side portion of the rib 1520 and a second side portion of the rib 1520. The side portions of the rib 1520 (which are separated by the substantially horizontal portion 1555) are connected elsewhere at one or more locations along the shutter 1502. The substantially horizontal portion 1555 provides a bending region for the shutter 1502 that facilitates localized deformation of the shutter 1502 and provides for the relief of stresses. Although the shutter 1502 is depicted with additional gaps or breaks adjacent to its beam attachment locations and its geometric center, such additional gaps or breaks can be omitted in some other implementations. Certain aspects of the substantially horizontal portion 1555 are similarly implemented as previously described with reference to the substantially horizontal portions 1160 and 1355 of FIG. 11A, FIG. 11B, FIG. 11C and FIG. 13.

In the example shown in FIG. 15, the substantially horizontal portion 1555 extends from a first edge 1582 to a directly opposing second edge 1584 of the shutter 1502. The first edge 1582 forms at least a portion of an outer periphery of the shutter 1502, and the second edge 1584 forms at least a portion of a perimeter of a shutter aperture 1556. More particularly, the first edge 1582 forms at least a portion of a side edge of the shutter 1502 (i.e., the edge of the shutter 1502 extending along its width or perpendicular to its length), and the second edge 1584 forms at least a portion of a side edge of the shutter aperture 1556 (i.e., the edge of the shutter aperture 1556 extending along its width or perpendicular to its length). As depicted in FIG. 15, the first edge 1582 and the second edge 1584 both are substantially parallel to a direction of motion 1570 of the shutter 1502.

In some implementations, the shutter assembly 1500 is manufactured using a mold that is patterned with indentations and at least one substantially horizontal portion. Deposition of a shutter material over the patterned mold followed by a further patterning stage yields the shutter 1502 including the stiffening ribs 1520 and 1522 and the substantially horizontal portion 1555.

The stress relief features described with reference to FIGS. 11A, 11B, 11C, 13 and 15 can be incorporated in a variety of MEMS-based displays and MEMS-based display assemblies. In addition to MEMS-based displays, the stress relief features described herein also can be incorporated in other types of MEMS assemblies. For example, in some implementations, such features are incorporated into other MEMS assemblies that include a suspended planar body supported over a substrate.

Figure 16:
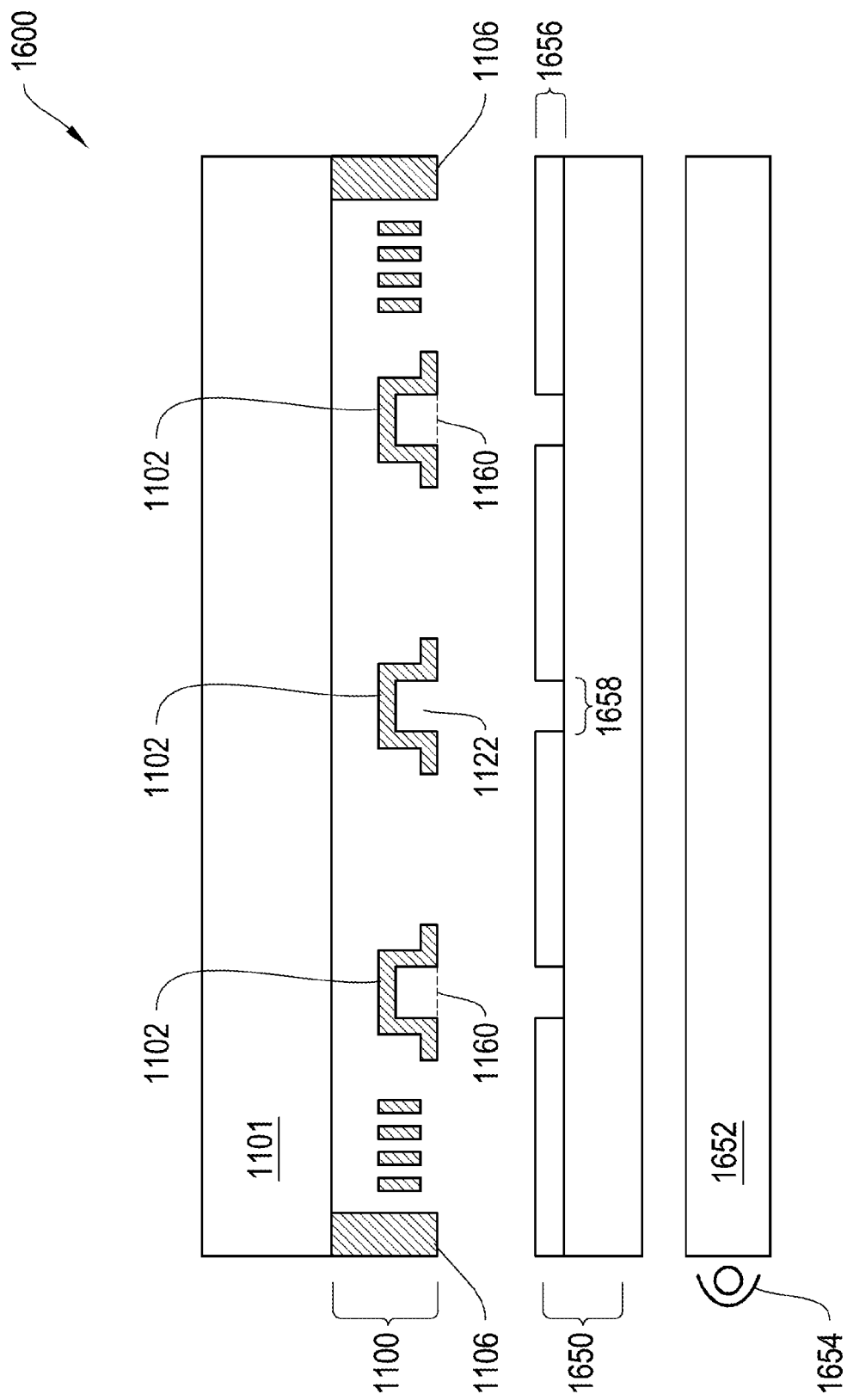
FIG. 16 shows a cross sectional view of a portion of an example display apparatus.

FIG. 16 shows a cross section of a portion of an example display apparatus 1600 including the shutter assembly 1100 of FIG. 11A, FIG. 11B and FIG. 11C. The display apparatus 1600, built according to a MEMS-down configuration, is in a closed position. The cross section is taken at line A-A' of FIG. 11A.

Referring to FIG. 16, the display apparatus 1600 includes an aperture plate 1650, a backlight 1652, and a light source 1654 for introducing light into the backlight 1652. The aperture plate 1650 includes an aperture layer 1656, which defines apertures 1658 through which light can exit the backlight 1652 towards the front of the display apparatus 1600 to be modulated by the shutter assembly 1100. The aperture layer 1656, in some implementations, includes a rear facing reflective layer and a front facing light absorbing layer. The shutter assembly 1100 is positioned across a gap from the aperture layer 1656. The gap can be maintained by a series of spacer posts connecting the aperture plate 1650 and the substrate 1101 on which the shutter assembly 1100 is formed. In some implementations, a fluid is disposed in the gap.

In the display apparatus 1600, the stiffening rib 1122 of the shutter 1102 protrudes towards the substrate 1101 such that the rib 1122 opens towards the aperture layer 1656. As depicted by dashed lines in FIG. 16, the substantially horizontal portions 1160 are provided as gaps or breaks along the rib 1122, and face towards the aperture layer 1656.

In other implementations, a display apparatus can be built in a MEMS-up configuration. That is, a shutter assembly included in such a display apparatus can be formed directly on an aperture plate, instead of an opposing substrate, as depicted in FIG. 16.

Figure 17A:
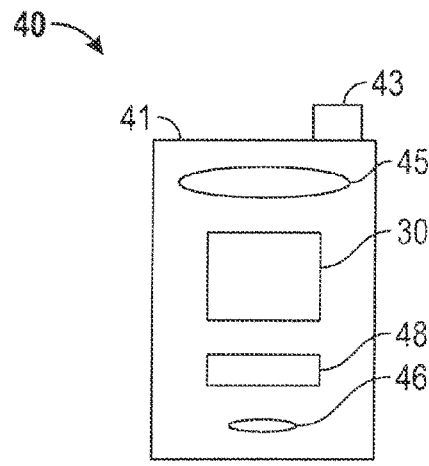
FIGS. 17A and 17B show example system block diagrams illustrating a display device that includes a set of display elements.
Figure 17B:
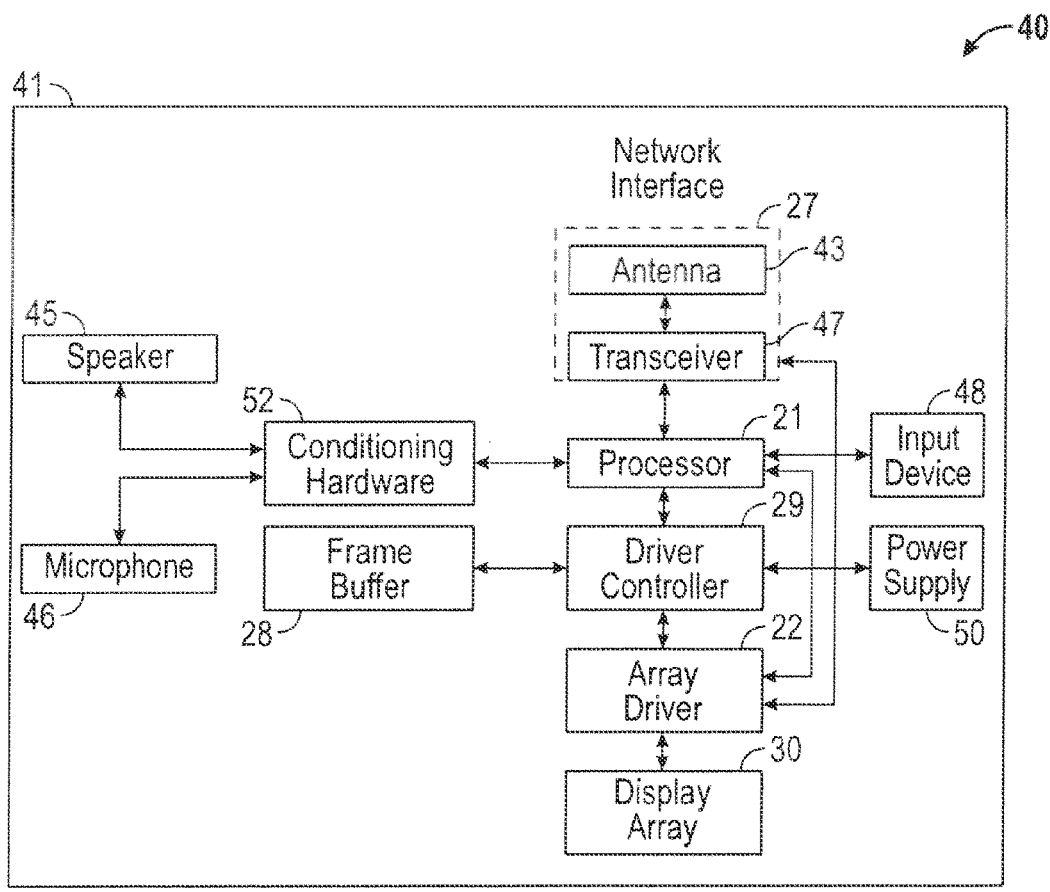

The stress relief features described above can be incorporated in various types of displays. FIGS. 17A and 17B are system block diagrams illustrating a display device 40 that includes a set of display elements. The display device 40 can be, for example, a smart phone, a cellular or mobile telephone. However, the same components of the display device 40 or slight variations thereof are also illustrative of various types of display devices such as televisions, computers, tablets, e-readers, hand-held devices and portable media devices.

As shown in FIG. 17A, the display device 40 includes a housing 41, a display 30, an antenna 43, a speaker 45, an input device 48 and a microphone 46. The housing 41 can be formed from any of a variety of manufacturing processes, including injection molding, and vacuum forming. In addition, the housing 41 may be made from any of a variety of materials, including, but not limited to: plastic, metal, glass, rubber and ceramic, or a combination thereof. The housing 41 can include removable portions (not shown) that may be interchanged with other removable portions of different color, or containing different logos, pictures, or symbols.

The display 30 may be any of a variety of displays, including a bi-stable or analog display, as described herein. The display 30 also can be configured to include a flat-panel display, such as plasma, EL, OLED, STN LCD, or TFT LCD, or a non-flat-panel display, such as a CRT or other tube device.

The components of the display device 40 are schematically illustrated in FIG. 17B. The display device 40 includes a housing 41 and can include additional components at least partially enclosed therein. For example, the display device 40 includes a network interface 27 that includes an antenna 43 which can be coupled to a transceiver 47. The network interface 27 may be a source for image data that could be displayed on the display device 40. Accordingly, the network interface 27 is one example of an image source module, but the processor 21 and the input device 48 also may serve as an image source module. The transceiver 47 is connected to a processor 21, which is connected to conditioning hardware 52. The conditioning hardware 52 may be configured to condition a signal (such as filter or otherwise manipulate a signal). The conditioning hardware 52 can be connected to a speaker 45 and a microphone 46. The processor 21 also can be connected to an input device 48 and a driver controller 29. The driver controller 29 can be coupled to a frame buffer 28, and to an array driver 22, which in turn can be coupled to a display array 30. One or more elements in the display device 40, including elements not specifically depicted in FIG. 17B, can be configured to function as a memory device and be configured to communicate with the processor 21. In some implementations, a power supply 50 can provide power to substantially all components in the particular display device 40 design.

The network interface 27 includes the antenna 43 and the transceiver 47 so that the display device 40 can communicate with one or more devices over a network. The network interface 27 also may have some processing capabilities to relieve, for example, data processing requirements of the processor 21. The antenna 43 can transmit and receive signals. In some implementations, the antenna 43 transmits and receives RF signals according to the IEEE 16.11 standard, including IEEE 16.11(a), (b), or (g), or the IEEE 802.11 standard, including IEEE 802.11a, b, g, n, and further implementations thereof. In some other implementations, the antenna 43 transmits and receives RF signals according to the Bluetooth® standard. In the case of a cellular telephone, the antenna 43 can be designed to receive code division multiple access (CDMA), frequency division multiple access (FDMA), time division multiple access (TDMA), Global System for Mobile communications (GSM), GSM/General Packet Radio Service (GPRS), Enhanced Data GSM Environment (EDGE), Terrestrial Trunked Radio (TETRA), Wideband-CDMA (W-CDMA), Evolution Data Optimized (EV-DO), 1xEV-DO, EV-DO Rev A, EV-DO Rev B, High Speed Packet Access (HSPA), High Speed Downlink Packet Access (HSDPA), High Speed Uplink Packet Access (HSUPA), Evolved High Speed Packet Access (HSPA+), Long Term Evolution (LTE), AMPS, or other known signals that are used to communicate within a wireless network, such as a system utilizing 3G, 4G or 5G technology. The transceiver 47 can pre-process the signals received from the antenna 43 so that they may be received by and further manipulated by the processor 21. The transceiver 47 also can process signals received from the processor 21 so that they may be transmitted from the display device 40 via the antenna 43.

In some implementations, the transceiver 47 can be replaced by a receiver. In addition, in some implementations, the network interface 27 can be replaced by an image source, which can store or generate image data to be sent to the processor 21. The processor 21 can control the overall operation of the display device 40. The processor 21 receives data, such as compressed image data from the network interface 27 or an image source, and processes the data into raw image data or into a format that can be readily processed into raw image data. The processor 21 can send the processed data to the driver controller 29 or to the frame buffer 28 for storage. Raw data typically refers to the information that identifies the image characteristics at each location within an image. For example, such image characteristics can include color, saturation and gray-scale level.

The processor 21 can include a microcontroller, CPU, or logic unit to control operation of the display device 40. The conditioning hardware 52 may include amplifiers and filters for transmitting signals to the speaker 45, and for receiving signals from the microphone 46. The conditioning hardware 52 may be discrete components within the display device 40, or may be incorporated within the processor 21 or other components.

The driver controller 29 can take the raw image data generated by the processor 21 either directly from the processor 21 or from the frame buffer 28 and can re-format the raw image data appropriately for high speed transmission to the array driver 22. In some implementations, the driver controller 29 can re-format the raw image data into a data flow having a raster-like format, such that it has a time order suitable for scanning across the display array 30. Then the driver controller 29 sends the formatted information to the array driver 22. Although a driver controller 29, such as an LCD controller, is often associated with the system processor 21 as a stand-alone Integrated Circuit (IC), such controllers may be implemented in many ways. For example, controllers may be embedded in the processor 21 as hardware, embedded in the processor 21 as software, or fully integrated in hardware with the array driver 22.

The array driver 22 can receive the formatted information from the driver controller 29 and can re-format the video data into a parallel set of waveforms that are applied many times per second to the hundreds, and sometimes thousands (or more), of leads coming from the display's x-y matrix of display elements.

In some implementations, the driver controller 29, the array driver 22, and the display array 30 are appropriate for any of the types of displays described herein. For example, the driver controller 29 can be a conventional display controller or a bi-stable display controller. Additionally, the array driver 22 can be a conventional driver or a bi-stable display driver. Moreover, the display array 30 can be a conventional display array or a bi-stable display array. In some implementations, the driver controller 29 can be integrated with the array driver 22. Such an implementation can be useful in highly integrated systems, for example, mobile phones, portable-electronic devices, watches or small-area displays.

In some implementations, the input device 48 can be configured to allow, for example, a user to control the operation of the display device 40. The input device 48 can include a keypad, such as a QWERTY keyboard or a telephone keypad, a button, a switch, a rocker, a touch-sensitive screen, a touch-sensitive screen integrated with the display array 30, or a pressure- or heat-sensitive membrane. The microphone 46 can be configured as an input device for the display device 40. In some implementations, voice commands through the microphone 46 can be used for controlling operations of the display device 40.

The power supply 50 can include a variety of energy storage devices. For example, the power supply 50 can be a rechargeable battery, such as a nickel-cadmium battery or a lithium-ion battery. In implementations using a rechargeable battery, the rechargeable battery may be chargeable using power coming from, for example, a wall socket or a photovoltaic device or array. Alternatively, the rechargeable battery can be wirelessly chargeable. The power supply 50 also can be a renewable energy source, a capacitor, or a solar cell, including a plastic solar cell or solar-cell paint. The power supply 50 also can be configured to receive power from a wall outlet.

In some implementations, control programmability resides in the driver controller 29 which can be located in several places in the electronic display system. In some other implementations, control programmability resides in the array driver 22. The above-described optimization may be implemented in any number of hardware and/or software components and in various configurations.

The various illustrative logics, logical blocks, modules, circuits and algorithm processes described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and processes described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, e.g., a combination of a DSP and a microprocessor, a plurality of microprocessors, one or more microprocessors in conjunction with a DSP core, or any other such configuration. In some implementations, particular processes and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

If implemented in software, the functions may be stored on or transmitted over as one or more instructions or code on a computer-readable medium. The processes of a method or algorithm disclosed herein may be implemented in a processor-executable software module which may reside on a computer-readable medium. Computer-readable media includes both computer storage media and communication media including any medium that can be enabled to transfer a computer program from one place to another. A storage media may be any available media that may be accessed by a computer. By way of example, and not limitation, such computer-readable media may include RAM, ROM, EEPROM, CD-ROM or other optical disk storage, magnetic disk storage or other magnetic storage devices, or any other medium that may be used to store desired program code in the form of instructions or data structures and that may be accessed by a computer. Also, any connection can be properly termed a computer-readable medium. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and instructions on a machine readable medium and computer-readable medium, which may be incorporated into a computer program product.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

Additionally, a person having ordinary skill in the art will readily appreciate, the terms "upper" and "lower" are sometimes used for ease of describing the figures, and indicate relative positions corresponding to the orientation of the figure on a properly oriented page, and may not reflect the proper orientation of any device as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one or more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

The invention claimed is:

1. An electromechanical system (EMS) assembly, comprising:
    a substrate;
    an anchor disposed on the substrate; and
    a suspended planar body supported over the substrate by the anchor, wherein the suspended planar body defines a first aperture and a second aperture and includes:
        at least one depression extending out of a plane of the suspended planar body, and
        a substantially horizontal portion corresponding to a gap in the at least one depression, wherein the substantially horizontal portion extends in a same plane as the plane of the suspended planar body from a first edge of the suspended planar body to an opposing second edge of the suspended planar body, the first edge forms at least a portion of a perimeter of the first aperture, and the second edge forms at least a portion of a perimeter of the second aperture.

2. The EMS assembly of claim 1, wherein a thickness of the suspended planar body at the first edge is substantially the same as a thickness of the suspended planar body at the second edge.

3. The EMS assembly of claim 1, wherein the substantially horizontal portion faces away from the substrate.

4. The EMS assembly of claim 1, wherein the substantially horizontal portion is disposed between portions of a single continuous depression.

5. The EMS assembly of claim 1, wherein the suspended planar body is a shutter of a shutter-based light modulator.

6. The EMS assembly of claim 1, wherein an extent of the gap is smaller than a width of the at least one depression.

7. The EMS assembly of claim 1, wherein the substantially horizontal portion overlaps a geometric center of the suspended planar body.

8. The EMS assembly of claim 1, wherein the first edge and the second edge are substantially perpendicular to a direction of motion of the suspended planar body.

9. An electromechanical system (EMS) assembly, comprising:
    a substrate;
    an anchor disposed on the substrate; and
    a suspended planar body supported over the substrate by the anchor, wherein the suspended planar body includes:
        at least one depression extending out of a plane of the suspended planar body, and
        a substantially horizontal portion corresponding to a gap in the at least one depression, wherein the substantially horizontal portion extends in a same plane as the plane of the suspended planar body from a first edge of the suspended planar body to an opposing second edge of the suspended planar body, at least one of the first edge and the second edge is substantially perpendicular to a length of the suspended planar body, and an extent of the gap is up to 20% of the length of the suspended planar body,
        wherein at least one of the first edge and the second edge is substantially parallel to a direction of motion of the suspended planar body.

10. The EMS assembly of claim 9, wherein the substantially horizontal portion is disposed between multiple, distinct depressions.

11. The EMS assembly of claim 9, wherein the extent of the gap is up to 10% of the length of the suspended planar body.

12. The EMS assembly of claim 9, wherein the suspended planar body is formed with an aperture, the first edge forms at least a portion of a side edge of the suspended planar body, and the second edge forms at least a portion of a side edge of the aperture.

13. The EMS assembly of claim 9, wherein a thickness of the suspended planar body at the first edge is substantially the same as a thickness of the suspended planar body at the second edge.

14. The EMS assembly of claim 9, wherein the substantially horizontal portion faces away from the substrate.

15. The EMS assembly of claim 9, wherein the suspended planar body is a shutter of a shutter-based light modulator.

* * * * *